(12) United States Patent
Fujikata

(10) Patent No.: US 10,533,262 B2
(45) Date of Patent: Jan. 14, 2020

(54) PLATING APPARATUS, SUBSTRATE HOLDER, PLATING APPARATUS CONTROLLING METHOD, AND STORAGE MEDIUM CONFIGURED TO STORE PROGRAM FOR INSTRUCTING COMPUTER TO IMPLEMENT PLATING APPARATUS CONTROLLING METHOD

(71) Applicant: EBARA CORPORATION, Tokyo (JP)

(72) Inventor: Jumpei Fujikata, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 16/283,611

(22) Filed: Feb. 22, 2019

(65) Prior Publication Data

US 2019/0186039 A1 Jun. 20, 2019

Related U.S. Application Data

(62) Division of application No. 15/612,863, filed on Jun. 2, 2017, now Pat. No. 10,273,594.

(30) Foreign Application Priority Data

Jun. 3, 2016 (JP) .................................. 2016-111802

(51) Int. Cl.
*C25D 17/06* (2006.01)
*C25D 17/00* (2006.01)
(Continued)

(52) U.S. Cl.
CPC ............... *C25D 17/06* (2013.01); *C25D 7/12* (2013.01); *C25D 17/001* (2013.01); *C25D 17/004* (2013.01); *C25D 21/12* (2013.01); *H01L 21/2885* (2013.01); *H01L 21/67253* (2013.01); *H01L 21/68785* (2013.01); *H01L 21/76879* (2013.01); *H01L 24/11* (2013.01); *H01L 24/742* (2013.01); *H01L 2224/117* (2013.01); *H01L 2224/11462* (2013.01)

(58) Field of Classification Search
CPC .... C25D 21/12; C25D 17/001; C25D 17/004; C25D 17/06; H01L 21/67253; H01L 21/68785
See application file for complete search history.

(56) References Cited

U.S. PATENT DOCUMENTS

| 2012/0100709 A1 | 4/2012 | Minami |
| 2013/0192983 A1 | 8/2013 | Fujikata |
| 2013/0255360 A1 | 10/2013 | Minami et al. |

FOREIGN PATENT DOCUMENTS

| JP | 2012-107311 A | 6/2012 |
| JP | 2013-155405 A | 8/2013 |

(Continued)

*Primary Examiner* — Nicholas A Smith
(74) *Attorney, Agent, or Firm* — Baker & Hostetler LLP

(57) ABSTRACT

Provided is a plating apparatus for plating a substrate by using a substrate holder including an elastic projection that seals a to-be-plated surface of the substrate, the plating apparatus comprising a measurement device configured to measure a deformed state of the elastic projection by measuring at least either one of a compression amount of the elastic projection and load applied to the elastic projection at a time when the substrate physically contacts the elastic projection of the substrate holder; and a controlling device configured to make a judgment on the basis of the measured deformed state as to whether sealing by the elastic projection is normal.

3 Claims, 13 Drawing Sheets

(51) Int. Cl.
    *C25D 7/12*         (2006.01)
    *C25D 21/12*      (2006.01)
    *H01L 21/288*     (2006.01)
    *H01L 21/67*      (2006.01)
    *H01L 21/687*     (2006.01)
    *H01L 21/768*     (2006.01)
    *H01L 23/00*      (2006.01)

(56) References Cited

FOREIGN PATENT DOCUMENTS

| | | | |
|---|---|---|---|
| JP | 2013-204057 | A | 10/2013 |
| JP | 2014-235034 | A | 12/2014 |

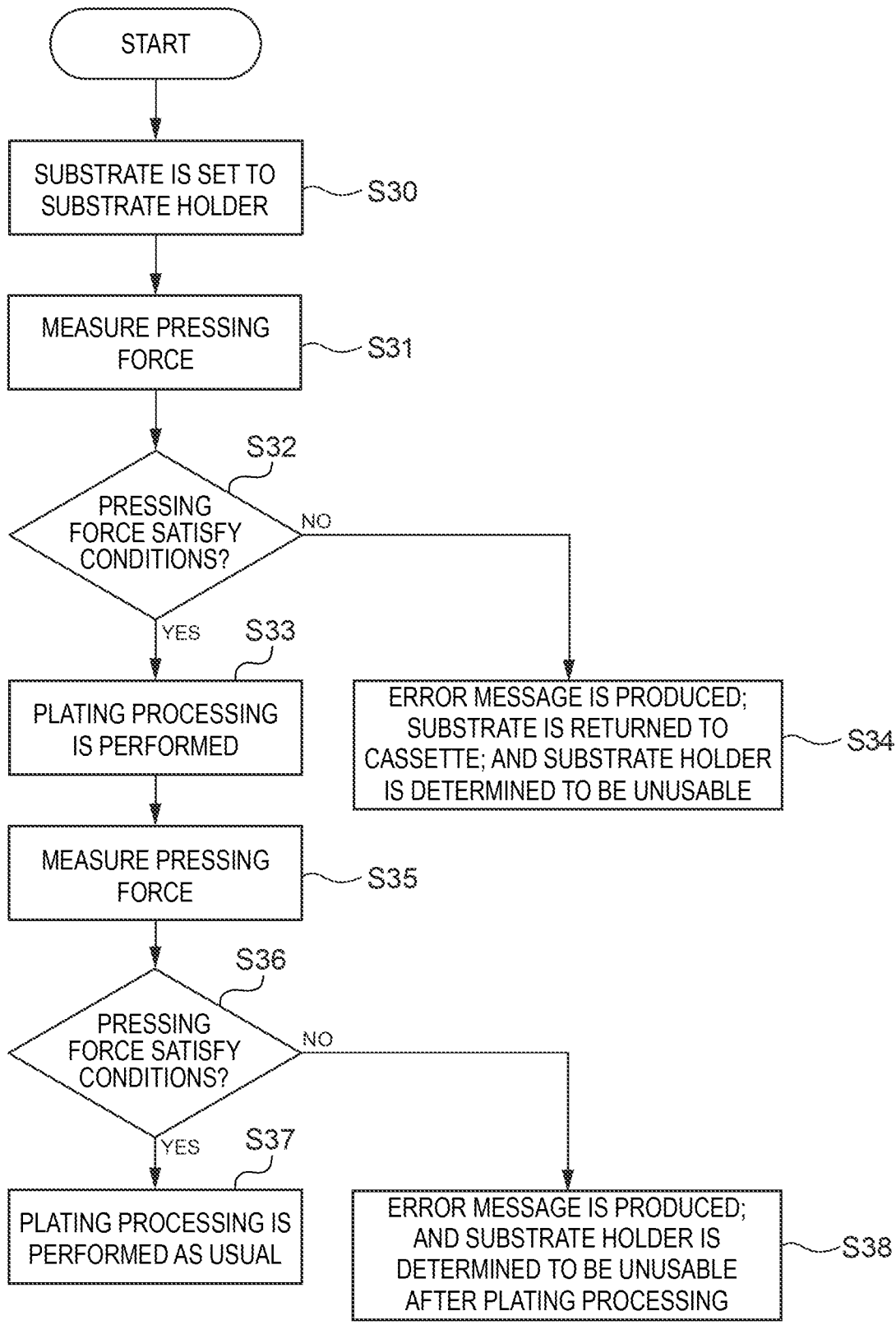

PLATING APPARATUS, SUBSTRATE HOLDER, PLATING APPARATUS CONTROLLING METHOD, AND STORAGE MEDIUM CONFIGURED TO STORE PROGRAM FOR INSTRUCTING COMPUTER TO IMPLEMENT PLATING APPARATUS CONTROLLING METHOD

CROSS-REFERENCE TO RELATED APPLICATIONS

This application is a Divisional of U.S. application Ser. No. 15/612,863 filed Jun. 2, 2017, which claims priority to Japanese Patent Application No. 2016-111802 filed Jun. 3, 2016, the disclosure of which is incorporated herein by reference in its entirety.

BACKGROUND OF THE INVENTION

Field of the Invention

The invention relates to a plating apparatus configured to plate a to-be-plated body (substrate) such as a semiconductor wafer, a plating apparatus controlling method, and a storage medium configured to store a program for instructing a computer to implement the plating apparatus controlling method.

Description of the Related Art

It has been practiced to form wiring in a microscopic wiring groove, a hole or an opening of a resist, which is provided in or on the surface of a semiconductor wafer or the like, and also form bumps (protruding electrodes) electrically contacting package electrodes in the surface of a semiconductor wafer or the like. Known methods for forming the wiring and the bumps include, for example, an electrolytic plating method, an evaporation method, a printing method, and a ball bump forming method. Along with the increase of I/O terminals on semiconductor chips and the decrease of pitches of the semiconductor chips, the electrolytic plating method is becoming more widely used because of its capability of producing smaller bumps and its relatively stable performance.

In recent years, there have been needs for performing plating processing with respect to substrates warped in various ways by means of plating apparatuses. Meanwhile, it is becoming known that, when the substrates warped in various ways are plated while being held by substrate holders, poor sealing contributes to occurrence of leakage and deteriorates the in-surface uniformity of a plating film.

Japanese Patent No. 5643239 (Patent Document 1) discloses a substrate holder configured to clamp the outer circumferential portion of a substrate by using first and second holding members. The first holding member is formed of a backing base and a movable base that is supported by a compression spring to be movable relative to the backing base. The substrate holder is designed so that, when the substrate is placed on the movable base and clamped between the first and second holding members, the substrate is biased toward the second holding member to absorb thickness change in the substrate, to thereby hold the substrate while maintaining the compression size of a seal member provided to the substrate holder within a definite range.

Japanese Patent No. 5782398 (Patent Document 2) discloses a substrate holder configured to clamp the outer circumferential portion of a substrate by using first and second holding members. When the substrate is held by the substrate holder, a gap between the first and second holding members is sealed with a first seal member of the second holding member, and at the same time, the outer circumferential portion of the substrate is sealed with a second seal member of the second holding member. This creates an internal space in the substrate holder by the first and second holding members and the substrate. The above-described plating method using the substrate holder conducts a first leakage test in which the internal space is vacuumed to see if the internal space reaches a predetermined vacuum pressure after the elapse of a predetermined period of time to check the sealing capabilities of the first and second seal members. The method then conducts a second leakage test that seals the internal space of the substrate holder holding the substrate, which has passed the first leakage test, to see if the pressure in the internal space reaches a predetermined or higher value within a predetermined period of time to further check the sealing capabilities of the first and second seal members. The method then performs the plating processing with respect to substrates by using the substrate holders that have passed the first and second leakage tests.

PRIOR ART DOCUMENT

Patent Document

Patent Document 1: Japanese Patent No. 5643239
Patent Document 2: Japanese Patent No. 5782398

SUMMARY OF THE INVENTION

In the substrate holder disclosed in the Patent Document 1, the movable base on which the substrate is placed is moved according to the warpage of the substrate to absorb thickness change in the substrate, to thereby maintain a fixed compression size of the seal members. The Patent Document 1, however, does not directly confirm the compression size (compression amount) of the seal members at the time when the substrate is clamped or held by the substrate holder.

The plating apparatus disclosed in the Patent Document 2 tests whether the pressure in the internal space sealed by the first and second seal members reaches the predetermined vacuum pressure within the predetermined period of time when the substrate is held by the substrate holder (first leakage test), and then tests whether the pressure in the internal space exceeds the predetermined value within the predetermined period of time (second leakage test). The plating apparatus, however, does not directly confirm the compression size (compression amount) of the seal members. The plating apparatus of the Patent Document 2 requires a vacuum pipe, a valve, a tracer gas source, and the like to be provided for conducting the first and second leakage tests.

Viewed in this light, it is desirable to directly confirm a deformed state (pressed state) of seal members at a time when a substrate is being held by a substrate holder for more secure plating processing. The direct confirmation of the deformed state (pressed state) of the seal members is desirable also for quick plating processing.

The applicant has learned that variation of the deformed state (pressed state) of the seal members at a time when the substrate is being held by the substrate holder on the substrate affects a sealing capability of the seal members in the process of plating. It is therefore desirable to eliminate or reduce such variation of the deformed state of the seal members on the substrate.

It is an object of the present invention to solve at least part of the problems mentioned above.

One aspect of the invention relates to a plating apparatus for plating a substrate by using a substrate holder including an elastic projection that seals a to-be-plated surface of the substrate. The plating apparatus comprising: a measurement device configured to measure a deformed state of the elastic projection by measuring at least either one of a compression amount of the elastic projection and load applied to the elastic projection at a time when the substrate physically contacts the elastic projection of the substrate holder; and a controlling device configured to make a judgment on the basis of the measured deformed state as to whether sealing by the elastic projection is normal. The plating apparatus here comprises not only a plating apparatus as a single body but also a system or apparatus in which the plating apparatus and a polishing apparatus are combined together, and an apparatus including a plating processer.

A substrate holder according to one aspect of the invention comprises: a first holding member including a support face with which a substrate comes into contact; a second holding member configured to clamp an outer circumferential portion of the substrate to detachably hold the substrate in consort with the first holding member; an elastic projection configured to seal a gap between the second holding member and the outer circumferential portion of the substrate when the substrate is clamped between the first and second holding members; and at least one pressure sensor that is disposed or embedded in the support face of the first holding member and configured to detect a pressing force at which the substrate is pressed by the second holding member and the elastic projection.

A plating apparatus controlling method according to one aspect of the invention is a method for controlling a plating apparatus configured to plate a substrate by using a substrate holder including an elastic projection that seals a to-be-plated surface of the substrate. According to the method, a deformed state of the elastic projection is measured by measuring at least either one of a compression amount of the elastic projection and load applied to the elastic projection at a time when the substrate physically contacts the elastic projection of the substrate holder. A judgment is made on the basis of the measured deformed state as to whether sealing by the elastic projection is normal. Plating processing is performed with respect to the substrate that is held by the substrate holder in which the sealing by the elastic projection is judged as normal.

A record medium according to one aspect of the invention is a storage medium configured to store a program for instructing a computer to implement the plating apparatus controlling method that performs plating processing with respect to a substrate by using a substrate holder including an elastic projection that seals a to-be-plated surface of the substrate. The storage medium stores a program for instructing the computer to measure the deformed state of the elastic projection by measuring at least either one of a compression amount of the elastic projection and load applied to the elastic projection at the time when the substrate physically contacts the elastic projection of the substrate holder, make a judgment as to whether sealing by the elastic projection is normal or abnormal on the basis of the measured deformed state, and perform the plating processing with respect to the substrate that is held by the substrate holder in which the sealing by the elastic projection is judged as normal.

BRIEF DESCRIPTION OF THE DRAWINGS

FIG. 14 is a flowchart of measurement and judgment according to Embodiment 3.

DESCRIPTION OF THE EMBODIMENTS

One embodiment relates to a plating apparatus, a plating apparatus controlling method, and a storage medium configured to store a program for instructing a computer to implement the plating apparatus controlling method, which are suitable for forming a plating film in a microscopic wiring groove, a hole or an opening of a resist, which is provided in or on the surface of a wafer, and also forming bumps (protruding electrodes) electrically contacting package electrodes in the surface of a semiconductor wafer.

The plating apparatus, the plating apparatus controlling method, and the storage medium configured to store the program for instructing the computer to implement the plating apparatus controlling method according to one embodiment can be used to, for example, embed a via hole in a process of fabricating an interposer or a spacer, which has a number of via plugs vertically extending through a substrate and is used for so-called three-dimensional packaging of semiconductor chips and the like. To be more specific, the plating apparatus, the plating apparatus controlling method, and the storage medium configured to store the program for instructing the computer to implement the plating apparatus controlling method according to the present invention can be used when a substrate is fixed to a holder, and the holder is immersed in a plating tank to plate the substrate.

One embodiment relates to a substrate holder used in a substrate processing apparatus such as a plating apparatus.

Embodiments of the invention will be explained below with reference to the attached drawings. In the following descriptions of the embodiments, identical or corresponding members will be provided to identical reference marks, and explanations thereof will be omitted to avoid overlap.

Figure 1:
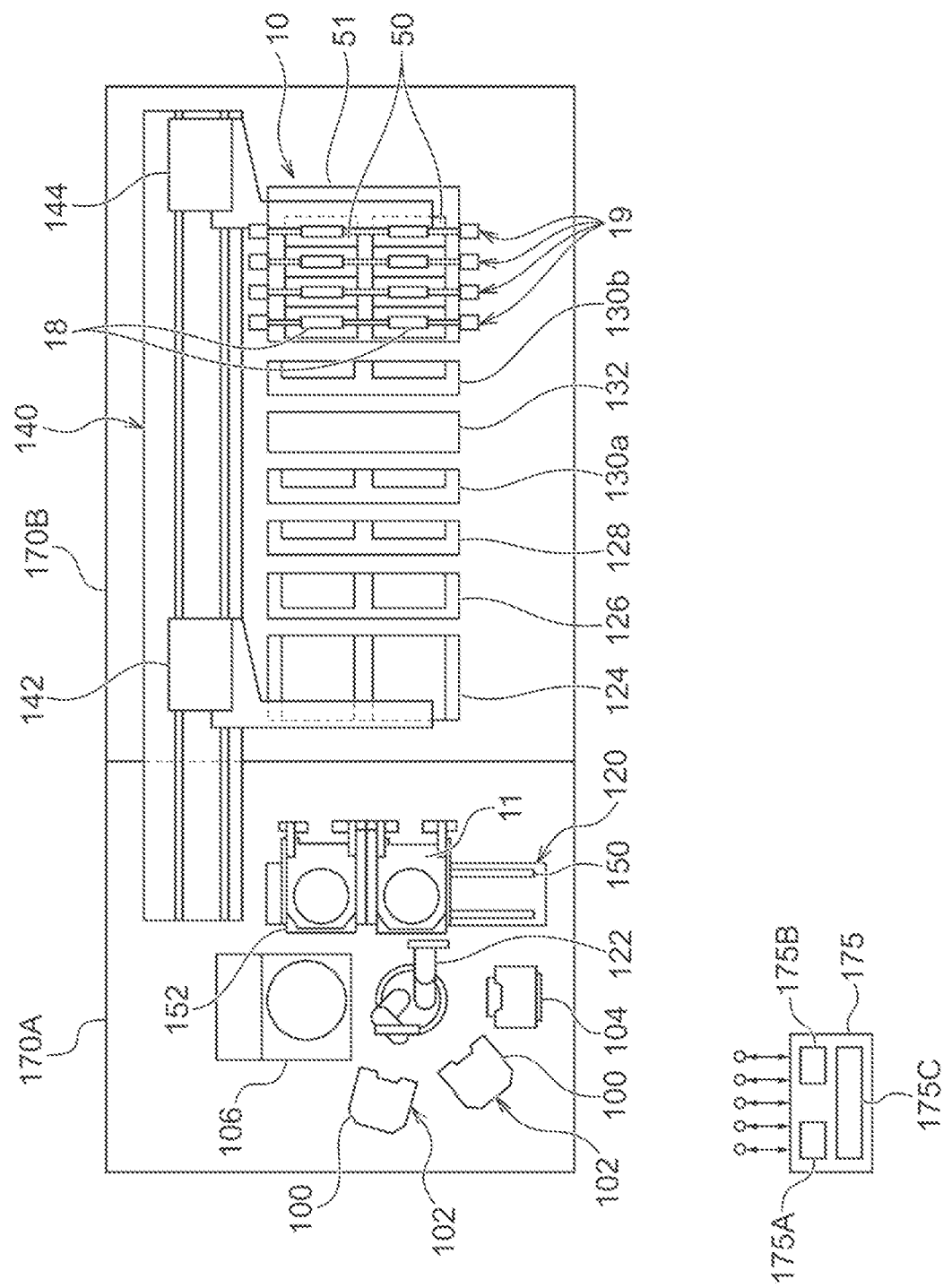
FIG. 1 is a view showing an overall layout of a plating apparatus according to one embodiment of the invention.

FIG. 1 is a view showing an overall layout of a plating apparatus according to one embodiment of the invention. As illustrated in FIG. 1, a plating apparatus 1 includes a load/unload section 170A configured to load a substrate W (see FIGS. 4A and 4B), which is a to-be-plated body such as a semiconductor wafer, onto a substrate holder 11 or unload the substrate W from the substrate holder 11, and a plating processing section 170B configured to process the substrate W.

The load/unload section 170A includes two cassette tables 102, an aligner 104 configured to align the position of an orientation flat or notch of the substrate W with a predetermined direction, and a spin rinse dryer 106 configured to rapidly spin and dry the substrate W that has been plated. The cassette table 102 is mounted with a cassette 100 that accommodates the substrate W such as a semiconductor wafer. In the vicinity of the spin rinse dryer 106, there is disposed a substrate attachment/detachment station (FIXING STATION) 120 configured to be mounted with the substrate holder 11 and carry out the attachment/detachment of the substrate W. Surrounded by the above-mentioned units, namely, the cassette table 102, the aligner 104, the spin rinse dryer 106, and the substrate attachment/detachment station 120 is a substrate transfer device 122 comprising a transfer robot configured to transfer the substrate W between the units.

The substrate attachment/detachment station 120 includes a flat placement plate 152 that is laterally slidable along rails 150. Two substrate holders 11 are horizontally juxtaposed on the placement plate 152. The substrate W is delivered between one of the substrate holders 11 and the substrate transfer device 122. The placement plate 152 is then slid in the lateral direction, and the substrate W is delivered between the other substrate holder 11 and the substrate transfer device 122.

The processing section 170B of the plating apparatus 1 includes a stocker 124, a prewet tank 126, a presoak tank 128, a first washing tank 130a, a blow tank 132, a second washing tank 130b, and a plating tank 10. The substrate holders 11 are stored and temporarily placed in the stocker (or referred to as a stocker container installing portion) 124. In the prewet tank 126, the substrate W is immersed in pure water. In the presoak tank 128, an oxide film on a surface of a conductive layer, such as a seed layer, which is formed on a surface of the substrate W, is removed by etching. In the first washing tank 130a, the substrate W that has been presoaked is washed together with the substrate holder 11 in washing fluid (pure water or the like). In the blow tank 132, the fluid is drained off from the substrate W that has been washed. In the second washing tank 130b, the substrate W that has been plated is washed in the washing fluid together with the substrate holder 11. The stocker 124, the prewet tank 126, the presoak tank 128, the first washing tank 130a, the blow tank 132, the second washing tank 130b, and the plating tank 10 are arranged in the order named. The above-described configuration of the processing section 170B of the plating apparatus 1 is one example. There is no limitation to the configuration of the processing section 170B of the plating apparatus 1, and the processing section 170B may be differently configured.

The plating tank 10 includes, for example, a plurality of plating cells (units) 50 having an overflow tank 51. The plating cells 50 accommodate respective substrates W in the inside thereof. The substrates W are thus immersed in plating fluid stored in the plating cells 50 so that surfaces of the substrates W are plated with copper, gold, silver, solder, nickel plate or the like.

The plating fluid here is not particularly limited in kind. Various kinds of plating fluids may be used for various purposes. For example, in a case of copper plating processing, the plating fluid is usually prepared to contain chemical species which are regarded as an inhibitor (surface active agent or the like) that acts to adsorb onto a copper surface using chlorine as a mediating element, an accelerator (organic sulfur compound or the like) that acts to accelerate the plating with respect to depressed areas, and a lubricating agent (quaternary amine or the like) for reducing a precipitation accelerating effect of the accelerator and thus improving flatness of film thickness.

The plating fluid may be plating fluid containing CoWB (cobalt tungsten boron), CoWP (cobalt tungsten phosphide), etc., for forming a metal film on the surface of the substrate W where Cu wiring is present. To prevent Cu from spreading in an insulating film, it is possible to use plating fluid for forming a barrier film that is provided to the surface of the substrate W and surfaces of the depressed areas of the substrate W before the Cu wiring is formed. For example, plating fluid containing CoWB or Ta (tantalum) may be used.

The plating apparatus 1 includes a substrate holder transfer device 140 adopting, for example, a linear motor system, which is located on the side of the above-mentioned devices (stocker 124, prewet tank 126, presoak tank 128, first washing tank 130a, blow tank 132, second washing tank 130b, plating tank 10, and substrate attachment/detachment station 120) and transfers the substrate holder 11 together with the substrate W between the devices. The substrate holder transfer device 140 includes a first transporter 142 and a second transporter 144. The first transporter 142 is configured to transfer the substrate W between the substrate attachment/detachment station 120, the stocker 124, the prewet tank 126, the presoak tank 128, the first washing tank 130a, and the blow tank 132. The second transporter 144 is configured to transfer the substrate W among the first washing tank 130a, the second washing tank 130b, the blow tank 132, and the plating tank 10. In another embodiment, the plating apparatus 1 may be provided with either one of the first transporter 142 and the second transporter 144.

A paddle 18 is disposed inside of each of the plating cells 50. The paddle 18 functions as a stirring rod for stirring the plating fluid in the plating cell 50. Disposed on either side of the overflow tank 51 are paddle driving devices 19 by which the paddles 18 are activated.

A plating system including more than one plating apparatus configured as described above includes a controller 175 configured to control the foregoing units and devices. The controller 175 includes a memory 175B that stores a predetermined program, a CPU (Central Processing Unit) 175A that implements a program of the memory 175B, and a controlling section 175C that is materialized when the CPU 175A implements the program. The controlling section 175C is capable of conducting, for example, transfer control on the substrate transfer device 122, transfer control on the substrate holder transfer device 140, control on plating current and time in the plating tank 10, control on an opening size of an anode mask (not shown) and a regulation plate (not shown) which are disposed in each of the plating cells 50, etc. The controller 175 is configured to be able to communicate with a host controller, not shown, which conducts integrated control on the plating apparatus 1 and the other associated devices, and thus can receive and send data from and to a database of the host controller. A storage medium comprising the memory 175B stores various programs, such as various setting data and a plating program mentioned later. The storage medium comprising the memory 175B further stores a program for controlling and implementing measurement of a deformed state of a substrate seal member 66 mentioned later, a judgment based on the measurement result, and processing based on the judgment. As the storage medium, it is possible to utilize a publicly-known medium, such as a computer readable memory like a ROM and a RAM, a hard disc, a CD-ROM, and a disc-like storage medium like a DVD-ROM and a flexible disc.

[Substrate Holder]

During the plating of the substrate W, the substrate holder 11 holds the substrate W so as to expose a to-be-plated surface of the substrate W while sealing an edge portion (rim and outer circumferential portion) and a back side of the substrate W from the plating fluid. The substrate holder 11 may include an interface (contact) that contacts a circumferential rim of the to-be-plate surface of the substrate W to feed power from an external power source to the circumferential rim. The substrate holder 11 is stored in the stocker 124 prior to the plating. During the plating, the substrate holder 11 is transferred between the stocker 124 and the processing tanks of the plating processing section 170B by the substrate holder transfer device 140. After the plating, the substrate holder 11 is stored back into the stocker 124. In the plating apparatus 1, the plating is performed in such a way that the substrate W held by the substrate holder 11 is vertically immersed in the plating fluid of the plating tank 10, and the plating fluid is injected from a bottom of the plating tank 10 and overflowed at the same time. The plating tank 10 preferably has a plurality of sections (plating cells 50). In each of the plating cells 50, the substrate holder 11 holding the substrate W is vertically immersed in the plating fluid to be plated. Each of the plating cells 50 preferably has an insert portion for the substrate holder 11, an electrifying portion for the substrate holder 11, the anode, the paddle 18, and a blocking plate. The anode is attached to an anode holder when used. An exposed surface of the anode, which is opposed to the substrate W, is concentric to the substrate W. The substrate W held by the substrate holder 11 is processed with processing fluids in the processing tanks of the plating processing section 170B.

For example, if the plating apparatus is of a type using two kinds of plating fluids, the processing tanks of the plating processing section 170B may be arranged in the order of steps, or more specifically, a water prewashing tank (prewet tank), a preprocessing tank (presoak tank), a rinsing tank (first washing tank), a first plating tank, a rinsing tank (second washing tank), a second plating tank, a rinsing tank (third washing tank), and a blow tank. Alternatively, another configuration may be formed. It is preferable to arrange the processing tanks in the order of the steps to eliminate an unnecessary transfer route. The kinds, number, and layout of the tanks in the plating apparatus 1 may be freely decided in consideration of an object of the processing of the substrate W.

The substrate holder transfer device 140 has an arm configured to suspend the substrate holder 11. The arm has a lifter (not shown) for holding the substrate holder 11 in a vertical position. The substrate holder transfer device 140 is movable along a travel axis between the load/unload section 170A, the processing tanks of the plating processing section 170B, and the stocker 124 by means of a transfer mechanism (not shown) such as a liner motor. The substrate holder transfer device 140 holds and transfers the substrate holder 11 in the vertical position. The stocker 124 is a stocker configured to store the substrate holder 11 and capable of accommodating a plurality of substrate holders 11 in the vertical position.

[Structure of the Substrate Holder]

Figure 2:
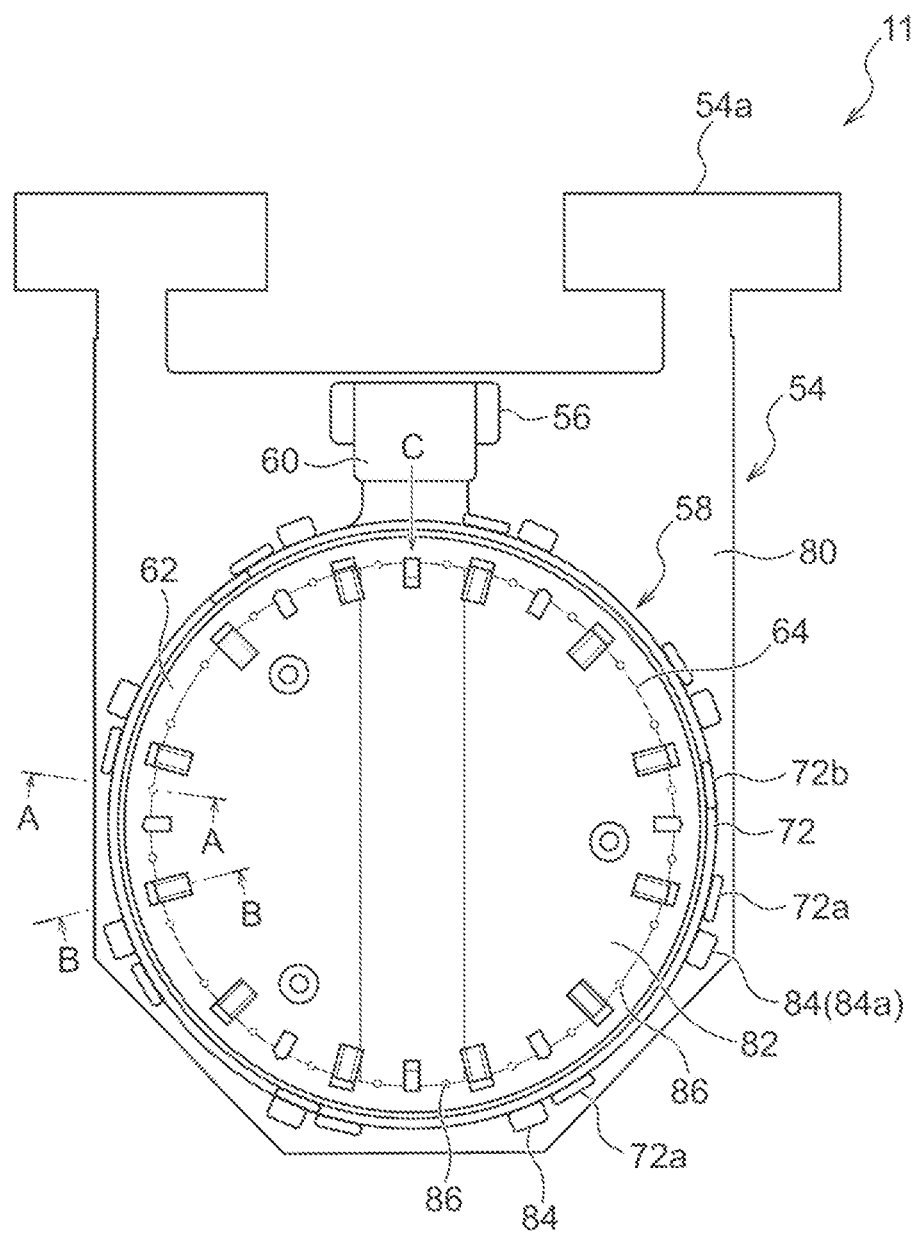
FIG. 2 is a plan view of a substrate holder illustrated in FIG. 1.
Figure 3:
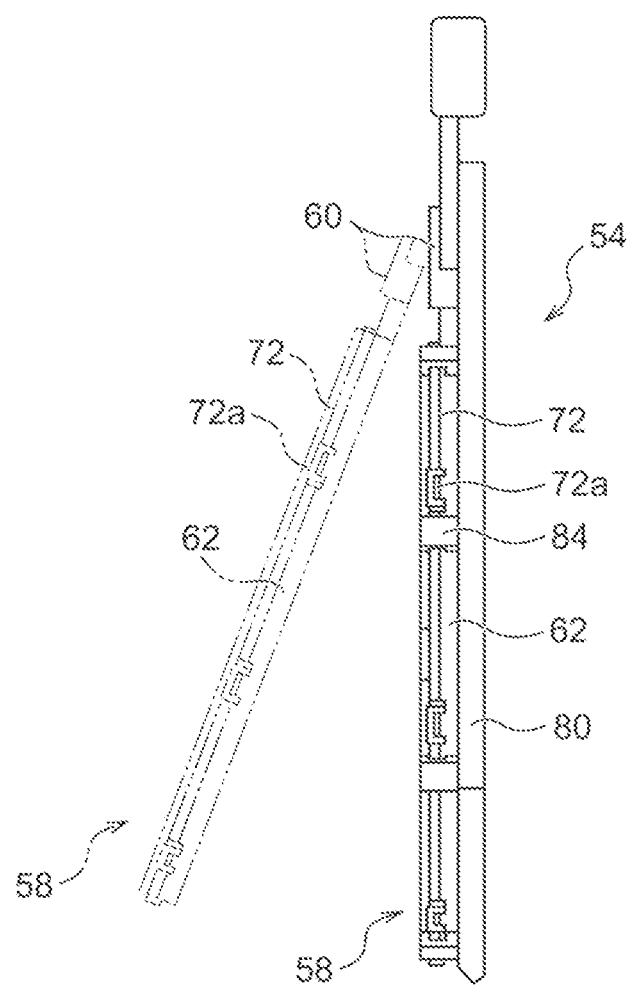
FIG. 3 is a view showing a right side face of the substrate holder illustrated in FIG. 1.
Figure 4A:
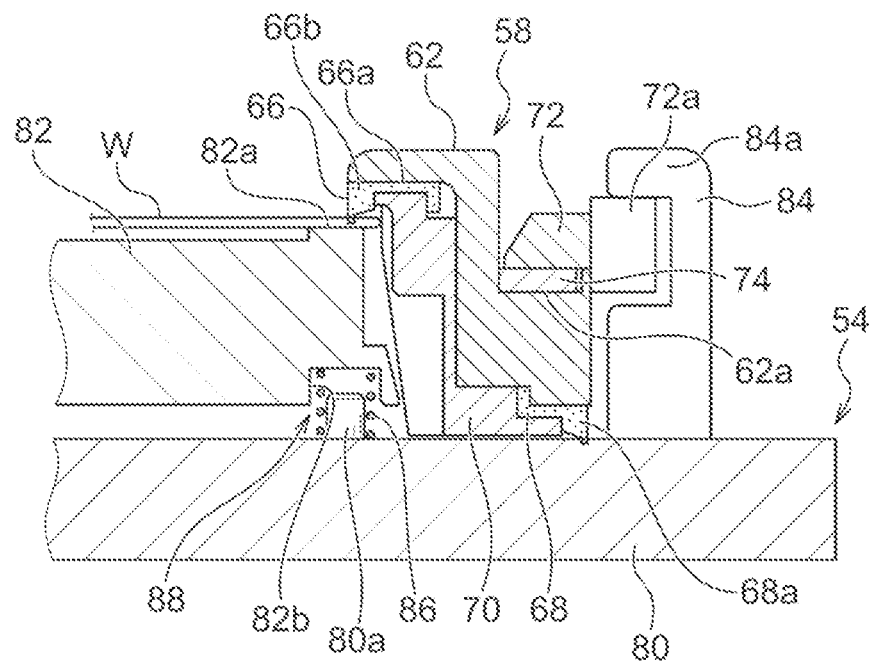
FIG. 4A is an enlarged cross-sectional view along the line A-A of FIG. 2.
Figure 4B:
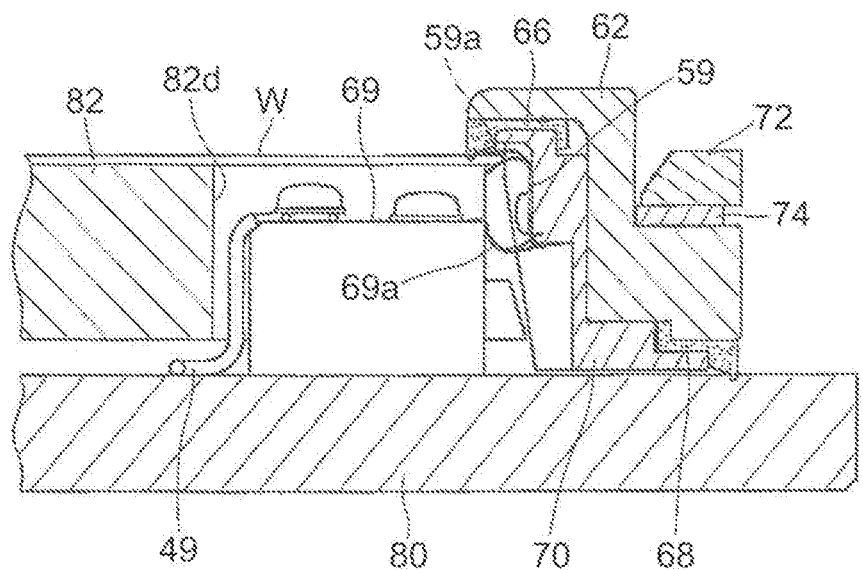
FIG. 4B is an enlarged cross-sectional view along the line B-B of FIG. 2.

FIG. 2 is a plan view of the substrate holder 11 illustrated in FIG. 1. FIG. 3 is a view of a right side face of the substrate holder illustrated in FIG. 1. FIG. 4A is an enlarged cross-sectional view along the line A-A of FIG. 2. FIG. 4B is an enlarged cross-sectional view along the line B-B of FIG. 2. As illustrated in FIGS. 2 to 4B, the substrate holder 11 includes a first holding member (fixed holding member) 54 that is, for example, made of vinyl chloride and has a rectangular flat plate-like shape, and a second holding member (movable holding member) 58 that is fixed to the first holding member 54 to be openable and closable about a hinge 56. In this example, the second holding member 58 is configured to be openable and closable about the hinge 56. However, for example, the second holding member 58 may be disposed in a position opposed to the first holding member 54 and moved toward the first holding member 54 to be opened/closed. The second holding member 58 includes a base portion 60 and a ring-like seal ring holder 62 made of, for example, vinyl chloride for facilitating sliding movement against a holddown ring 72 mentioned later. The substrate seal member 66 is attached to a face of the seal ring holder 62, which is opposed to the first holding member 54, so as to protrude inward. The substrate seal member 66 comes into press-contact with the outer circumferential portion of the substrate W along a substrate seal line 64 of the outer circumferential portion of the substrate W to seal the outer circumferential portion of the substrate W when the substrate W is held by the substrate holder 11. Further attached to the face of the seal ring holder 62, which is opposed to the first holding member 54, is a holder seal member 68 that comes into press-contact with an backing base 80 (mentioned later) of the first holding member 54 at a place located on the outer side than the substrate seal member 66 to seal this place. When the substrate W is held by the substrate holder 11, the to-be-plated surface of the substrate W is exposed through an opening of the ring-like seal ring holder 62. An elastic seal (substrate seal member 66 in the illustrated example) may be configured to seal a gap between the second holding member 58 (for example, the seal ring holder 62) and the outer circumferential portion of the substrate W. The elastic seal may be detachable from the second holding member 58 (for example, the seal ring holder 62). Alternatively, the elastic seal and the second holding member 58 may be integrally configured as a component part of the second holding member 58. In this specification, an edge portion of the substrate W is a region with which an electrical contact (first contact member 59 mentioned later) comes into contact or a region closer to the circumferential rim of the substrate W than a portion with which the elastic seal comes into contact when the substrate W is held by the substrate holder 11. For example, according to the present embodiment, the edge portion of the substrate W is a region located closer to the outer circumference of the substrate W than a portion with which a lip (not shown) of the elastic seal comes into contact. The edge portion of the substrate W expands about 5 mm, or more preferably, about 2 mm from the outer circumferential rim of the substrate W toward a center of the substrate. The outer circumferential portion of the substrate W includes a region that expands from the outer circumferential rim of the substrate W to not only the edge portion but also an outermost circumferential region of a resist portion of the substrate W (for example, a region that expands about 8 mm from the outer circumferential rim of the substrate W toward the center of the substrate W).

The substrate seal member 66 and the holder seal member 68 are clamped between the seal ring holder 62 and a fixed ring 70 that is fastened to the seal ring holder 62 with a fastening tool such as a bolt, and thus fastened to the seal ring holder 62. In a contact face (upper face) of the substrate seal member 66, which is in contact with the seal ring holder 62, there is a projecting portion 66a that seals a gap between the substrate seal member 66 and the seal holder 62.

A stepped portion 62a is disposed in an outer circumferential portion of the seal ring holder 62 of the second holding member 58. The holddown ring 72 is rotatably mounted on the stepped portion 62a with a spacer 74 clamped therebetween. The holddown ring 72 is mounted so as to be unable to escape by a presser board (not shown) that is fastened to a lateral face of the seal ring holder 62 to protrude outward. The holddown ring 72 is made of, for example, titanium that is excellent in acid corrosion resistance and has sufficient rigidity. The spacer 74 is made of a material having low friction coefficient, for example, PTEF for smooth rotation of the holddown ring 72.

The first holding member 54 includes the backing base 80 that has a substantially flat plate-like shape and comes into press-contact with the holder seal member 68 to seal a gap between the first and second holding members 54 and 58 when the substrate W is held by the substrate holder 11, and a substantially disc-like movable base 82 that is separated from the backing base 80. A pair of substantially T-shaped hands 54a is formed continuously from an end portion of the backing base 80. The hands 54a function as support portions when the substrate holder 11 is transferred, and supported in a suspending position. Inverted L-shaped clampers 84 are provided in a standing manner to the backing base 80 of the first holding member 54 at regular intervals along a circumferential direction to be located in the outer side of the holddown ring 72. The clampers 84 each have an inward projection 84a that is projecting inward. Protruding portions 72a protruding outward are provided to the holddown ring 72 at positions along the circumferential direction of the holddown ring 72 to face the respective clampers 84. A lower face of the inward projection 84a of the clamper 84 and an upper face of the protruding portion 72a of the holddown ring 72 form tapered faces by inclining in opposite directions along a rotational direction. Raised portions (not shown) projecting upward are disposed in a plurality of places (44 places, for example) along the circumferential direction of the holddown ring 72. The holddown ring 72 can be rotated by rotating a rotating pin (not shown) to press the raised portions sideways.

The substrate W is inserted in a central portion of the first holding member 54 while the second holding member 58 is open as shown by virtual lines in FIG. 3. The second holding member 58 is then closed about the hinge 56. The holddown ring 72 is rotated clockwise so that the protruding portions 72a of the holddown ring 72 slide into inside the inward projections 84a of the clampers 84. The first holding member 54 and the second holding member 58 are secured and locked together through the tapered faces provided to the protruding portions 72a of the holddown ring 72 and the inward projections 84a of the clampers 84, and the substrate W is locked in a position clamped by the substrate holder 11. If the holddown ring 72 is rotated anticlockwise to pull the protruding portions 72a of the holddown ring 72 out of the inward projections 84a of the inverted L-shaped clampers 84, the locking by the substrate holder 11 can be released.

The movable base 82 is vertically movably disposed in the backing base 80 with a thickness absorbing mechanism 88 intervening therebetween. The thickness absorbing mechanism 88 comprises a compression spring 86. The thickness absorbing mechanism 88 further comprises a protruding portion 80a located on the backing base 80 and a recessed portion 82b formed in a lower face of the movable base 82. A lower end of the compression spring 86 is inserted in and engaged with the protruding portion 80a, whereas an upper end of the compression spring 86 is inserted in the recessed portion 82b. The compression spring 86 expands and contracts in a straight vertical line because of the protruding portion 80a and the recessed portion 82b. The movable base 82 has a shape and dimensions corresponding to the outer circumferential portion of the substrate W and further includes a ring-like support face 82a that comes into contact with the outer circumferential portion of the substrate W to support the substrate W when the substrate W is held by the substrate holder 11. The movable base 82 is attached to the backing base 80 through the compression spring 86 so as to be biased in a direction moving away from the backing base 80 and to be movable against a biasing force (spring force) of the compression spring 86 in a direction approaching the backing base 80. The thickness absorbing mechanism 88 is thus configured to absorb the thickness of the substrate W by the movable base 82 moving in the direction approaching the backing base 80 according to the thickness of the substrate W against the biasing force (spring force) of the compression spring 86 when the substrate W having different thickness is held by the substrate holder 11.

In other words, as described above, when the second holding member 58 is locked to the first holding member 54 to hold the substrate W by means of the substrate holder 11, lower ends of downward projections 66b located in inner circumferential surfaces (radially inner side) of the substrate seal members 66 come into press-contact with places positioned along a substrate seal line 64 of the outer circumferential portion of the substrate W that is held by the substrate holder 11. At the same time, lower ends of downward projections 68a located in outer circumferential surfaces (radially outer side) of the holder seal members 68 come into press-contact with a surface of the backing base 80 of the first holding member 54. The seal members 66 and 68 are thus uniformly pressed to seal the above-mentioned points. At this time, the movable base 82 moves so that a moving amount relative to the backing base 80 varies with changes in thickness of the substrate W. More specifically, the thicker the substrate W is, the larger the moving amount of the movable base 82 relative to the backing base 80 is, and the closer the movable base 82 approaches the backing base 80. The change of thickness of the substrate W is thus absorbed by the thickness absorbing mechanism 88.

A plurality of first contact members 59 are attached to an inner circumferential surface of the fixed ring 70 of the second holding member 58 as illustrated in FIG. 4B. The plurality of first contact members 59 are configured to come into press-contact with the edge portion of the substrate W and thus feed power to the substrate W when the substrate W is held by the substrate holder 11. The first contact members 59 are located on the outer side of the substrate seal member 66 and each have a contact 59a protruding inward in a shape like a plate spring. The first contact members 59 are easily bent at the contacts 59a due to spring characteristics exerted by an elastic force of the contacts 59a. When the substrate W is held by the substrate holder 11, the contacts 59a of the first contact members 59 elastically contact an outer circumferential surface of the substrate W.

The movable base 82 includes cutoff portions 82d in a circumferential rim thereof to be located at positions corresponding to the respective first contact members 59. Each of the cutoff portions 82d is formed by cutting off the movable base 82 inwardly in a rectangular shape. Second contact members 69 are disposed at positions corresponding to the respective cutoff portions 82d of the backing base 80. The second contact member 69 is connected to a wire 49 extending from an external contact provided to the hand 54a. The second contact member 69 has contacts 69a protruding outward in a shape like a plate spring. The second contact members 69 are easily bent at the contacts 69a due to spring characteristics exerted by an elastic force of the contacts 69a. When the substrate W is held by the substrate holder 11, the contacts 69a of the second contact members 69 elastically contact the first contact members 59. When the substrate W is held by the substrate holder 11, the substrate W is fed with power through the first and second contact members 59 and 69.

The present embodiment explains the configuration in which the substrate W is first placed on the first holding member 54 and then clamped between the first and second holding members 54 and 58. However, it is also possible to utilize a (so-called facedown) substrate holder in which the first and second holding members 54 and 58 are inverted upside down. In this case, the substrate W is first placed on the second holding member 58 and then clamped between the first and second holding members 54 and 58.

[Checking Device for Checking the Substrate Support Face]

Figure 5:
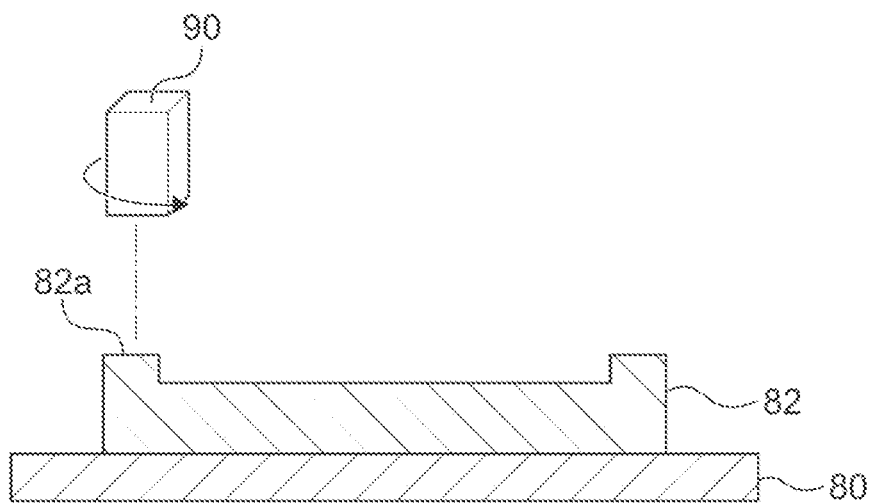
FIG. 5 is a schematic view that explains a configuration for checking a support face of the substrate holder.

FIG. 5 is a schematic view that explains a configuration for checking a support face of the substrate holder. According to the present embodiment, the substrate holder 11 is transferred to the substrate attachment/detachment station 120. In order to check if there is abnormality such as irregularity in a substrate receiving face (the support face 82a of the substantially disc-shaped movable base 82) of the substrate holder 11 prior to the placement of the substrate W, an optical sensor 90 (FIG. 5) that functions as a checking device is disposed above the substrate attachment/detachment station 120. The optical sensor irradiates, for example, red, green, and blue lights from above the substrate holder 11 onto the substrate holder 11. A photo of a reflected light is taken by a camera located above, and thus, information of color phase thereof is detected in the form of a two-dimensional image. The image is used to judge presence of irregularity on the surface. For simplicity's sake, FIG. 5 schematically shows only the backing base 80 and the movable base 82 of the substrate holder 11. The configuration of the compression spring 86, the clampers 84 and the like are not shown.

According to another example of the configuration of the checking device for checking the substrate support face 82a, instead of the optical sensor 90, an after-mentioned sensor configured to detect distance by using a magnetic field or an after-mentioned sensor configured to detect distance by using electromagnetic waves may be disposed above the substrate attachment/detachment station 120 illustrated in FIG. 5. In another example, a light such as a laser beam is irradiated from an optical source onto a to-be-irradiated object, and a light reflected from the to-be-irradiated object is received by a sensor. On the basis of information as to how much time has been required, information about distance to the to-be-irradiated object is related to information about a measurement position, to thereby obtain information about plane height of a to-be-measured face.

The plating apparatus provided with the checking device for checking the substrate support face 82a performs the plating processing in the following steps. The substrate holder transfer device 140 is used to transfer the substrate holder 11 from the stocker 124 to the substrate attachment/detachment station 120. A judgment is made by the checking device for checking the substrate support face 82a as to whether there is abnormality such as irregularity in the substrate receiving face (the support face 82a of the substantially disc-shaped movable base 82) of the substrate holder 11 placed on the substrate attachment/detachment station 120. The substrate holder 11 in which abnormality has been found as the result of the check is immediately moved from the substrate attachment/detachment station 120 using the substrate holder transfer device 140. The substrate holder 11 that has passed the check remains on the substrate attachment/detachment station 120. The substrate W is then transferred from the cassette 100 to the substrate attachment/detachment station 120 by the substrate transfer device 122 and mounted on the substrate holder 11. The inventors learned through discussions that, if there was abnormality such as irregularity in the substrate receiving face of the substrate holder, this could be one of the causes for leakage from the substrate holder 11. As described above, if the substrate support face of the substrate holder is checked before the substrate is mounted, it is possible to prevent leakage from the substrate holder 11, attributable to abnormality such as irregularity in the substrate receiving face of the substrate holder.

According to the present embodiment, the substrate attachment/detachment station 120 of the plating apparatus is situated in a horizontal position but may be installed in a vertical position. Even if the substrate attachment/detachment station 120 is in the vertical position, it is still possible to use a checking device configured in the same manner as the foregoing checking device to check the substrate receiving face of the substrate holder 11, remove the substrate W from the substrate holder 11 that has failed the check, move the substrate holder 11 from the substrate attachment/detachment station 120, and cause the substrate holder 11 that has passed the check to hold the substrate W.

Embodiment 1

Figure 6:
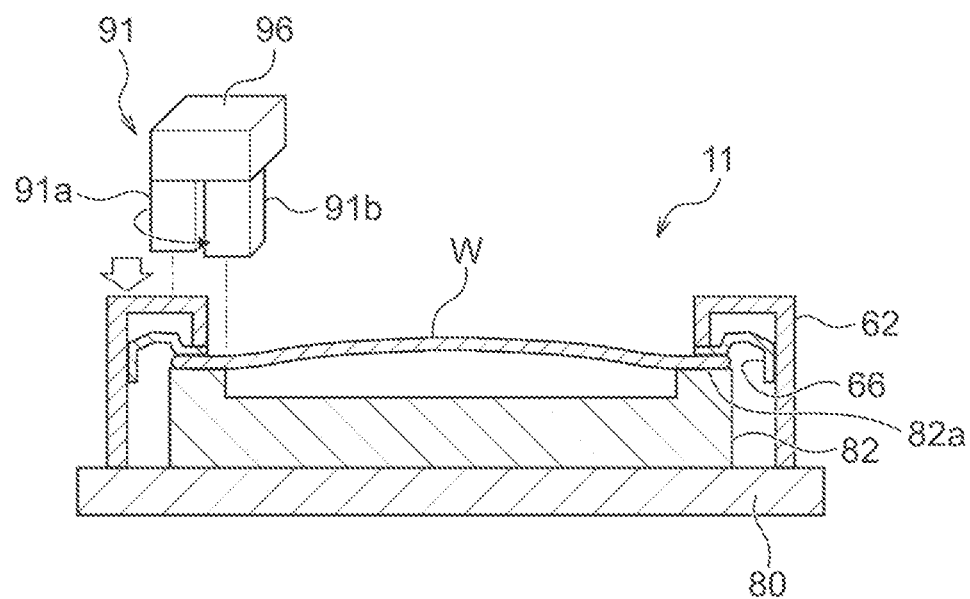
FIG. 6 shows a configuration of a measurement device according to Embodiment 1, which measures a deformed state of a seal.

FIG. 6 shows a configuration of a measurement device that measures a deformed state in a seal according to an Embodiment 1. FIG. 6 shows the substrate holder 11 placed on the substrate attachment/detachment station 120. For simplicity's sake and easy understanding, FIG. 6 schematically shows the backing base 80, the movable base 82, the seal ring holder 62, and the substrate seal member 66 as the substrate holder 11, and omits the configuration including the compression spring 86, the clampers 84, etc.

According to the present embodiment, the substrate attachment/detachment station 120 includes a distance sensor 91 positioned above the substrate holder 11. More specifically, the distance sensor 91 is configured to be able to be positioned above the seal ring holder 62 of the substrate holder 11 and the support face 82a of the backing base 80. The distance sensor 91 includes a first sensor 91a and a second sensor 91b. The first sensor 91a and the second sensor 91b are optical distance sensors configured to, for example, irradiate lights such as laser beams and electromagnetic waves onto a to-be-measured object and receive a reflected wave thereof to measure distance. The first sensor 91a and the second sensor 91b may be sensors that use a magnetic field to detect distance, sensors that use an electromagnetic wave to detect distance, or the like. The first sensor 91a and the second sensor 91b may be any sensors as long as they are capable of detecting distance. The first sensor 91a is positioned above the seal ring holder 62 and detects or measures distance from the first sensor 91a to an upper face of the seal ring holder 62. The second sensor 91b is positioned above the substrate W on the support face 82a and detects or measures distance from the second sensor 91b to an upper face of the substrate W. Distance between the upper face of the seal ring holder 62 and the upper face of the substrate W is obtained by obtaining difference between the distances mentioned above. The first sensor 91a and the second sensor 91b are, for example, arranged to be on the same level. However, the first sensor 91a and the second sensor 91b do not have to be on the same level if the positions of the first and second sensors 91a and 91b are corrected before being outputted. The first sensor 91a and the second sensor 91b may detect or measure the distance from a common reference position (for example, a bottom face of a pressing member 92 mentioned in the Embodiment 2) to the upper face of the seal ring holder 62 and the upper face of the substrate W, respectively. If difference between the distances mentioned above is obtained, distance between the upper face of the seal ring holder 62 and the upper face of the substrate W can be obtained.

According to the present embodiment, the substrate W is placed on the first holding member 54 of the substrate holder 11, and the second holding member 58 is closed. While the substrate W is pressed onto the support face 82a of the substrate holder 11 by using the pressing member (not shown), or after the substrate holder 11 is locked after the substrate W is pressed onto the support face 82a of the substrate holder 11 by using the pressing member, distances da and db to the upper face of the seal ring holder 62 and the upper face of the substrate W are detected or measured by the distance sensor 91 (first and second sensors 91a and 91b). Difference d=db-da (distance between the upper face of the seal ring holder 62 and the upper face of the substrate W) is thus calculated. A state, in which the clampers 84 of the substrate holder 11 are engaged with the holddown ring 72 while the substrate W is clamped by the substrate holder 11, is called a substrate holder lock state. In the present embodiment, "compression amount" is measured while the substrate seal member 66 is being compressed in the substrate holder lock state. If the distance between the upper face of the seal ring holder 62 and the upper face of the substrate W before the pressing force is applied to the substrate seal member 66 is d0 (initial value), the "compression amount" of the substrate seal member 66 (deformed state of the seal) $\Delta d = d0 - d$ can be calculated. The distance d0 between the upper face of the seal ring holder 62 and the upper face of the substrate W before the pressing force is applied to the substrate seal member 66 corresponds to the sum of thickness of the substrate seal member 66 and thickness of the seal ring holder 62 located above the substrate seal member 66. Therefore, with respect to the substrate holder 11 to be used, data concerning the above thicknesses are previously obtained or measured. Another embodiment may use the distance sensor 91 to measure the distance d0 between the upper face of the seal ring holder 62 and the upper face of the substrate W before the pressing force is applied to the substrate seal member 66 with the second holding member 58 closed.

With regard to the calculation of d=db-da, either the distance sensor 91 or the controller 175 may be used to calculate the difference. As the pressing member, the pressing member 92 (see FIG. 9) driven by a motor drive mechanism 94 according to an Embodiment 2 described later may be used.

Given that a maximum value and a minimum value of the "compression amounts" $\Delta d$ that are measured at a plurality of places of the outer circumferential portion of the substrate W (including a case in which the entire outer circumferential portion is checked) are $\Delta d_{max}$ and $\Delta d_{mini}$, respectively, whether sealing by the substrate seal member 66 is normal is judged as below on the basis of the "compression amounts" $\Delta d$.

If the measured "compression amounts" $\Delta d$ ($\Delta d_{max}$ to $\Delta d_{mini}$) are equal to or higher than a predetermined minimum acceptable value $\Delta d_{low}$ ($\Delta d_{low} \leq \Delta d$) and fall in a predetermined value range $\Delta d_{range}$ ($|\Delta d_{max} - \Delta d_{mini}| \leq \Delta d_{range}$), it is judged that the sealing by the substrate seal member 66 is normal. If the "compression amounts" $\Delta d$ ($\Delta d_{max}$ to $\Delta d_{mini}$) are lower than the predetermined minimum acceptable value $\Delta d_{low}$ ($\Delta d < \Delta d_{low}$) or higher than the predetermined value range $\Delta d_{range}$ ($|\Delta d_{max} - \Delta d_{mini}| > \Delta d_{range}$), it is judged that the sealing by the substrate seal member 66 is abnormal. The plating processing is performed with respect to the substrate W that is held by the substrate holder 11 in which the sealing by the substrate seal member 66 has been judged as normal. If the sealing by the substrate seal member 66 is judged as abnormal, the pressing of the seal ring holder 62 is stopped, and an error message is produced. The substrate W is removed from the substrate holder 11 and returned to the cassette 100. The subject substrate holder 11 is determined to be unusable. The predetermined minimum acceptable value $\Delta d_{low}$ and the predetermined value range $\Delta d_{range}$ are previously set on the basis of an experiment or the like as conditions for determining the normality of the sealing by the substrate seal member 66.

The distance sensor 91 is moved by, for example, a scanner 96 so as to scan the circumference of the outer circumferential portion of the substrate W. A judgment is made as to whether measured values of the measured compression amounts $\Delta d$, which have been measured over the entire circumference of the outer circumferential portion of the substrate W, are equal to or higher than the predetermined minimum acceptable value $\Delta d_{low}$ and fall within the predetermined value range $\Delta d_{range}$. In this case, the compression amounts can be measured over the entire circumference of the substrate W by using the single distance sensor 91. The present embodiment shows the configuration in which the distance da to the upper face of the seal ring holder 62 and the distance db to the upper face of the substrate W are simultaneously measured by the first sensor 91a and the second sensor 91b of the distance sensor 91. When the distance sensor 91 includes a single sensor (either one of the first and second sensors 91a and 91b), the distances da and db may be measured by scanning the entire circumference of the upper face of the substrate W after scanning the entire circumference of the upper face of the seal ring holder 62 or by carrying out the scanning in the reverse order.

A plurality of (for example, 16) distance sensors 91 may be arranged at regular intervals above the outer circumferential portion of the substrate W to make a judgment as to whether the "compression amounts" Δd measured by the plurality of distance sensors 91 are equal to or higher than the predetermined minimum acceptable value $\Delta d_{low}$ and fall within the predetermined value range $\Delta d_{range}$. In this case, the scanner 96 (see FIG. 6) for scanning the distance sensor 91 may be omitted.

Figure 7A:
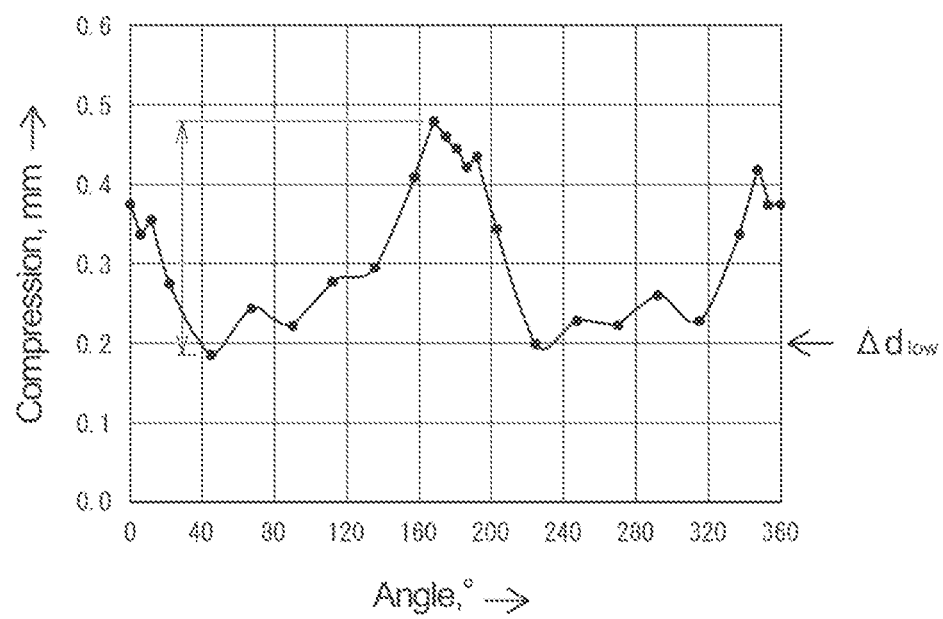
FIG. 7A shows an example of a measurement result of "compression amount" at each position in the outer circumferential portion of a substrate W in a situation where sealing is abnormal.
Figure 7B:
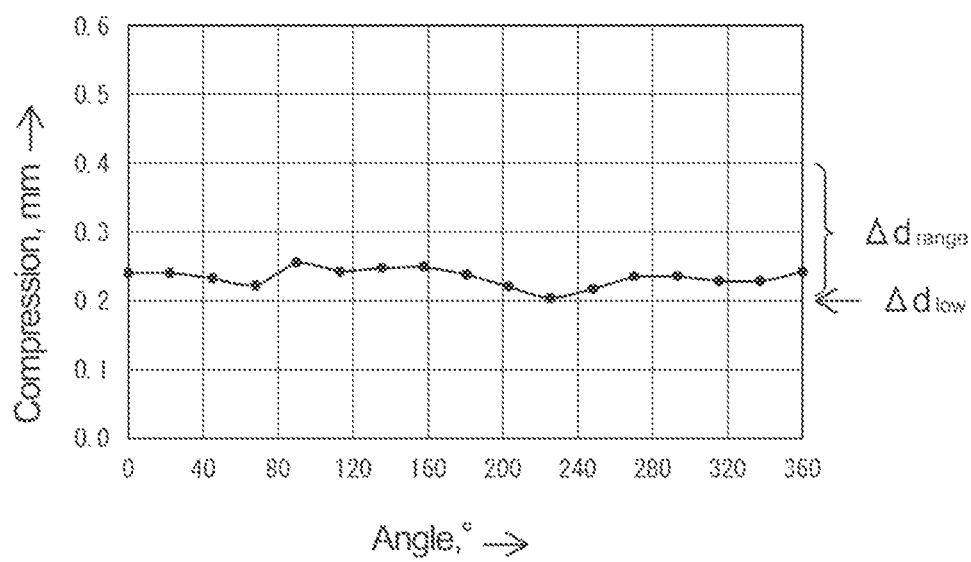
FIG. 7B shows an example of a measurement result of "compression amount" at each position in the outer circumferential portion of the substrate W in a situation where the sealing is normal.

FIG. 7A shows an example of a measurement result of the "compression amounts" at respective positions in the outer peripheral portion of the substrate W in a situation where sealing is abnormal. FIG. 7B shows an example of a measurement result of the "compression amounts" at respective positions in the outer peripheral portion of the substrate W in a situation where the sealing is normal. The above measurement results are the results of measurement of the "compression amounts" in the state where the substrate seal member 66 is compressed in the substrate holder lock state. In graphs of FIGS. 7A and 7B, a vertical axis represents a measurement result of the "compression amounts" Δd, and a horizontal axis represents the positions on the circumference of the outer peripheral portion of the substrate W. The positions on the circumference of the outer peripheral portion of the substrate W are each indicated by an angle on a condition that a position at which a radius of the substrate W passes a center of the base portion 60 of the substrate holder 11 is zero degree (position shown by arrow C in FIG. 2), and that the radius of the substrate W moves clockwise. In this example, the predetermined minimum acceptable value $\Delta d_{low}$ is 0.2 mm, and the predetermined value range $\Delta d_{range}$ is 0.2 mm. In FIG. 7B, all the measurement results of the "compression amounts" Δd are equal to or higher than the predetermined minimum acceptable value $\Delta d_{low}$=0.2 mm. In FIG. 7B, the minimum value $\Delta d_{mini}$ and the maximum value $\Delta d_{max}$ of the measurement results are 0.2 mm and 0.26 mm respectively, and $|\Delta d_{max}-\Delta d_{mini}|$=0.6 mm is within the predetermined value range $\Delta d_{range}$=0.2 mm. It is therefore judged that the sealing by the substrate seal member 66 is normal. In contrast, FIG. 7A includes the "compression amount" Δd that is lower than 0.2 mm ($\Delta d<\Delta d_{low}$), so that the sealing by the substrate seal member 66 is judged as abnormal. In FIG. 7A, the minimum value $\Delta d_{mini}$ and the maximum value $\Delta d_{max}$ of the measurement results are 0.19 mm and 0.49 mm, respectively, and $|\Delta d_{max}-\Delta d_{mini}|$=0.3 mm is higher than the predetermined value range $\Delta d_{range}$=0.2 mm. For this reason, too, the sealing by the substrate seal member 66 is judged as abnormal.

Figure 8:
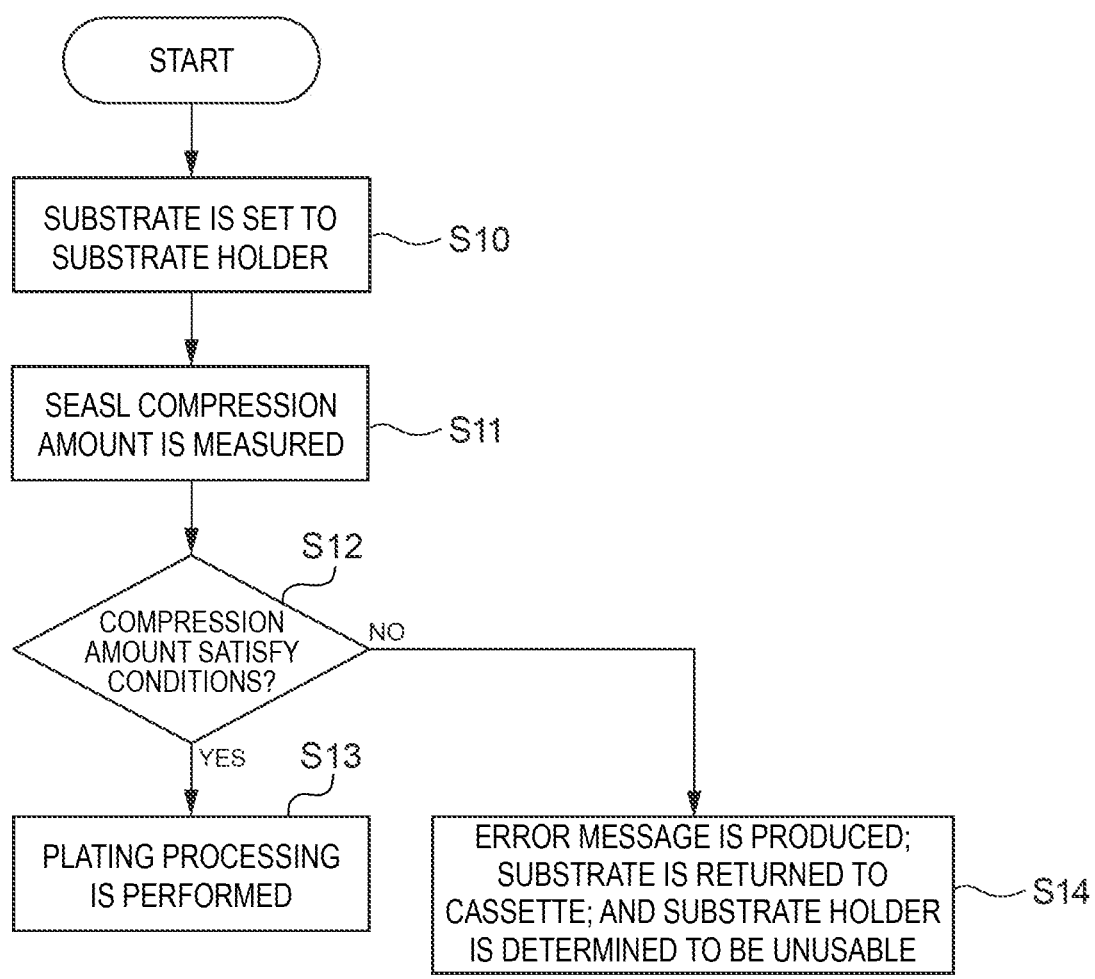
FIG. 8 is a flowchart showing measurement and judgment according to Embodiment 1.

FIG. 8 is a flowchart showing measurement and judgment according to the Embodiment 1. The measurement and the judgment are controlled and carried out according to the program stored in the memory 175B.

In Step S10, the substrate W is placed on the support face 82a of the substrate holder 11 of the substrate attachment/detachment station 120, and the substrate holder 11 is closed. The substrate holder 11 is then pressed downward by the pressing member, not shown.

In Step S11, while the substrate W is pressed by the substrate holder 11 through the pressing by the pressing member, or in the substrate holder lock state after the substrate holder 11 is locked after the substrate W is pressed by the substrate holder 11 through the pressing by the pressing member, the distance sensor 91 scans over the entire outer circumferential portion of the substrate W. The first sensor 91a and the second sensor 91b are used to measure the distance da to the upper face of the seal ring holder 62 and the distance db to the upper face of the substrate W. The difference of the distances da and db, namely, d=db−da, is subtracted from an initial value d0, to thereby calculate the "compression amount" Δd=d0−d.

Alternatively, while the substrate W is pressed by the substrate holder 11 through the pressing by the pressing member, or in the substrate holder lock state after the substrate holder 11 is locked after the substrate W is pressed by the substrate holder 11 through the pressing by the pressing member, the first and second sensors 91a and 91b of the plurality of distance sensors 91 are used to measure the distances da to the upper face of the seal ring holder 62 and the distances db to the upper face of the substrate W at a plurality of places (for example, sixteen points) of the substrate W. The difference of the distances at the foregoing positions, namely, d=db−da, is subtracted from the initial value d0, to thereby calculate the "compression amount" Δd=d0−d.

Step S12 makes a judgment as to whether the compression amounts Δd measured over the entire outer circumferential portion of the substrate W are equal to or higher than the predetermined minimum acceptable value $\Delta d_{low}$ and fall within the predetermined value range $\Delta d_{range}$. Alternatively, Step S12 makes a judgment as to whether the "compression amounts" Δd (for example, the "compression amount" at sixteen points) measured by the plurality of distance sensors 91 disposed at a plurality of places are equal to or higher than the predetermined minimum acceptable value $\Delta d_{low}$ and fall within the predetermined value range $\Delta d_{range}$. If the "compression amounts" Δd are equal to or higher than the predetermined minimum acceptable value $\Delta d_{low}$ and fall within the predetermined value range $\Delta d_{range}$, it is judged that the sealing by the substrate seal member 66 is normal. The process advances to Step S13, which performs the plating processing. However, if the "compression amounts" Δd are lower than the predetermined minimum acceptable value $\Delta d_{low}$ or higher than the predetermined value range $\Delta d_{range}$, the sealing by the substrate seal member 66 is judged as abnormal. The process moves to Step S14, which stops the pressing by the seal ring holder 62 and produces the error message. Step S14 further removes the substrate W from the substrate holder 11 and returns the substrate W to the cassette 100. The subject substrate holder 11 is determined to be unusable.

Since the initial value d0 is a fixed value, it is also possible to check if the sealing by the substrate seal member 66 is normal, on the basis of the distance during compression d(=db−da). When the measured value of the distance d is equal to or lower than a predetermined maximum value $d_{high}$ and falls within a predetermined value range $d_{range}$ the sealing by the substrate seal member 66 is judged as normal. Otherwise, the sealing by the substrate seal member 66 is judged as abnormal. The predetermined maximum value $d_{high}$ and the predetermined value range $d_{range}$ are previously set on the basis of an experiment or the like as conditions for determining the normality of the sealing by the substrate seal member 66.

According to a method of the Embodiment 1, prior to the plating processing, the deformed state of the seal at the time when the substrate W is held by the substrate holder 11 can be directly measured on the basis of the compression amount of the substrate seal member 66, and a judgment can be made on the basis of the measurement result as to whether the plating processing will be carried out. It is then possible to previously detect the leakage of the substrate seal member 66 and prevent defective plating. Therefore, the electrolytic plating processing can be carried out on preferable plating process conditions. It is also possible to delay the progress of leakage-associated wear damage or deterioration of parts, such as contacts, in the substrate holder. Since the thickness change of the substrate W can be absorbed by the thickness absorbing mechanism 88 according to the substrate holder 11, even if the thickness of the substrate W is changed, it is possible to maintain good sealing at the time when the substrate W is held by the substrate holder 11. This prevents a plating fluid leakage, damages on the substrate W, etc. Since the plating processing is carried out after it is confirmed that the compression amounts measured over the entire circumference of the substrate W fall within the predetermined value range, it is possible to prevent defective sealing attributable to variation of the deformed state, which is caused by variation in location of the seal member. The compression amounts measured over the entire circumference of the substrate W fall within the predetermined value range. In the plating tank, therefore, the distance to an anode electrode can be made uniform over the entire circumference of the substrate W (variation can be made to fall within the predetermined value range), and the flow of the plating fluid can be made uniform over the entire circumference of the substrate W.

Embodiment 2

Figure 9:
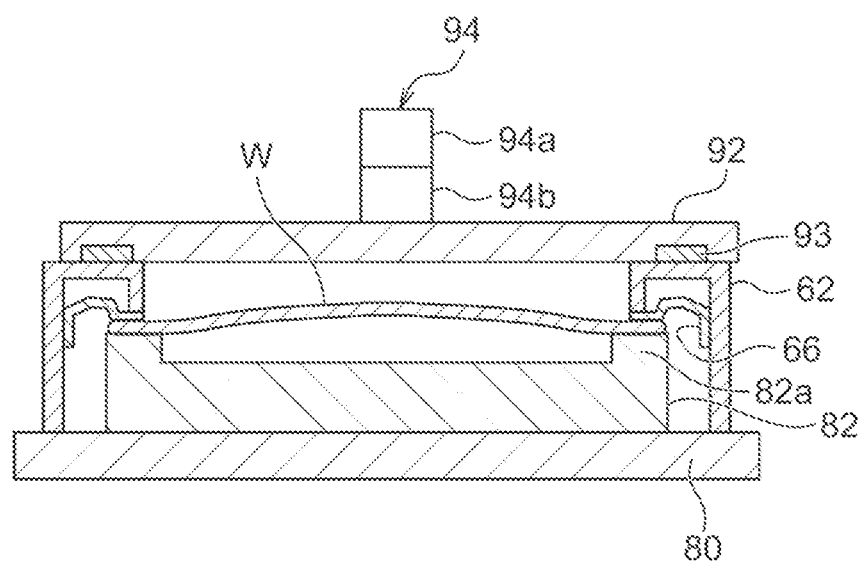
FIG. 9 shows a configuration of a measurement device configured to measure a deformed state of a seal according to Embodiment 2.

FIG. 9 shows a configuration of a measurement device that measures a deformed state of the seal according to an Embodiment 2. FIG. 9 shows the substrate holder 11 and the pressing member 92, which are placed on the substrate attachment/detachment station 120. For simplicity's sake and easy understanding, FIG. 9 schematically shows the backing base 80, the movable base 82, the seal ring holder 62, and the substrate seal member 66, as the substrate holder 11, and omits the configuration including the compression spring 86, the clampers 84, etc.

The pressing member 92 is a disc-like member having a shape and size substantially corresponding to those of the upper face of the seal ring holder 62. The pressing member 92 preferably has substantially the same or larger diameter as or than the upper face of the seal ring holder 62. If the substrate W has a shape other than the disc-like shape, such as a rectangular shape, the pressing member 92 is likewise formed to have a shape other than the disc-like shape, such as a rectangular shape, to correspond to the shape and size of the substrate W. On a circumference of an outer circumferential portion of a lower face of the pressing member 92 (which corresponds to the circumference of the outer circumferential portion of the substrate W), a plurality of load cells 93 are disposed to coincide with the upper face of the seal ring holder 62. For example, sixteen load cells 93 are arranged at regular intervals along the circumference of the outer circumferential portion of the substrate W. In another example, if the substrate W has a rectangular shape, it is possible to provide two load cells 93 in the vicinity of each corner so that at least each corner of the outer circumferential portion of the substrate W is located between the corresponding two load cells 93. In other words, eight load cells 93 in total.

The load cell 93 is a converter or a pressure sensor, which senses load of a compression force and converts the load into an electric signal. For example, a strain gauge method or the like may be employed. When the pressing member 92 is pushed against the upper face of the seal ring holder 92, the load cell 93 detects load, with which the pressing member 92 presses the seal ring holder 62 (load applied to the substrate seal member 66) at a position of each load cell 93.

The pressing member 92 is driven by the motor drive mechanism 94 and configured to make vertical motion to move toward and away from the substrate holder 11. The motor drive mechanism 94 includes a motor 94a and a rotary-linear motion converting mechanism 94b, such as a ball-screw mechanism, which converts rotary motion made by the motor 94a into linear motion (vertical motion).

The measurement device for measuring the deformed state of the seal according to the present embodiment is configured so that, when the substrate W is held by the substrate holder 11, the seal ring holder 62 and the substrate seal member 66 are pushed against the substrate W by using the pressing member 92 in the substrate attachment/detachment station 120. In the substrate attachment/detachment station 120, the substrate W is placed on the ring-like support face 82a of the substrate holder 11, and the substrate holder 11 is closed to clamp the substrate W. The motor drive mechanism 94 is then driven to move the pressing member 92 downward and thus bring the lower face of the pressing member 92 into contact with the upper face of the seal ring holder 62. The seal ring holder 62 and the substrate seal member 66 are pushed against the substrate W by using the pressing member 92. Distance (position) at which the pressing member 92 is downwardly moved by the motor drive mechanism 94 is previously stored by teaching or set. The pressing member 92 is position-controlled to move downward to the position that has been previously stored by teaching or set. More specifically, a position at which the upper face of the protruding portion 72a of the holddown ring 72 of the substrate holder 11 becomes slightly lower than the lower face of the inward projection 84a of the clamper 84 by moving the pressing member 92 downward is previously stored by teaching or set. The foregoing position is set with reference to the upper face of the placement plate 152 of the substrate attachment/detachment station 120 on which the substrate holder 11 is placed.

Before the substrate holder 11 holding the substrate W is locked while being pressed downward by the pressing member 92, the load is detected or measured by the plurality of load cells 93 disposed in the lower face of the pressing member 92. The present embodiment uses the load cells 93 to detect or measure load p as the deformed state of the substrate seal member 66. It is judged from the load p as below whether the sealing by the substrate seal member 66 is normal, where a maximum value and a minimum value of the measured values of the loads p measured by the plurality of load cells 93 are $p_{max}$ and $p_{mini}$, respectively.

If the measured loads p ($p_{max}$ to $p_{mini}$) are equal to or lower than a predetermined maximum acceptable value $p_{high}$ ($p \leq p_{high}$) and also fall within a predetermined value range $p_{range}$ ($|p_{max} - p_{mini}| \leq p_{range}$) the sealing by the substrate seal member 66 is judged as normal. Alternatively, the sealing by the substrate seal member 66 may be judged as normal if the measured loads p ($P_{max}$ to $p_{mini}$) are equal to or higher than a minimum acceptable value $p_{low}$ and also fall within the predetermined value range $p_{range}$ ($|p_{max} - p_{mini}| \leq p_{range}$).

If the loads p ($P_{max}$ to $p_{mini}$) are higher than the predetermined maximum acceptable value $p_{high}$ ($p_{high} < p$) or higher than the predetermined value range $p_{range}$ ($|p_{max} - p_{mini}| > p_{range}$) it is judged that the sealing by the substrate seal member 66 is abnormal. Alternatively, if the loads p ($P_{max}$ to $p_{mini}$) are lower than the predetermined minimum acceptable value $p_{low}$ ($p < p_{low}$) or higher than the predetermined value range $p_{range}$ ($|p_{max} - p_{mini}| > p_{range}$), the sealing by the substrate seal member 66 is judged as abnormal.

The plating processing is performed with respect to the substrate W held by the substrate holder 11 in which the sealing by the substrate seal member 66 has been judged as normal. When the sealing by the substrate seal member 66 is judged as abnormal, the pressing by the seal ring holder 62 is stopped, and the error message is produced. The substrate W is removed from the substrate holder 11 and returned to the cassette 100. The subject substrate holder 11 is determined to be unusable. The predetermined maximum acceptable value $p_{high}$, the predetermined minimum acceptable value $p_{low}$, and the predetermined value range $p_{range}$ are previously set on the basis of an experiment or the like as conditions for determining the normality of the sealing by the substrate seal member 66.

Figure 10:
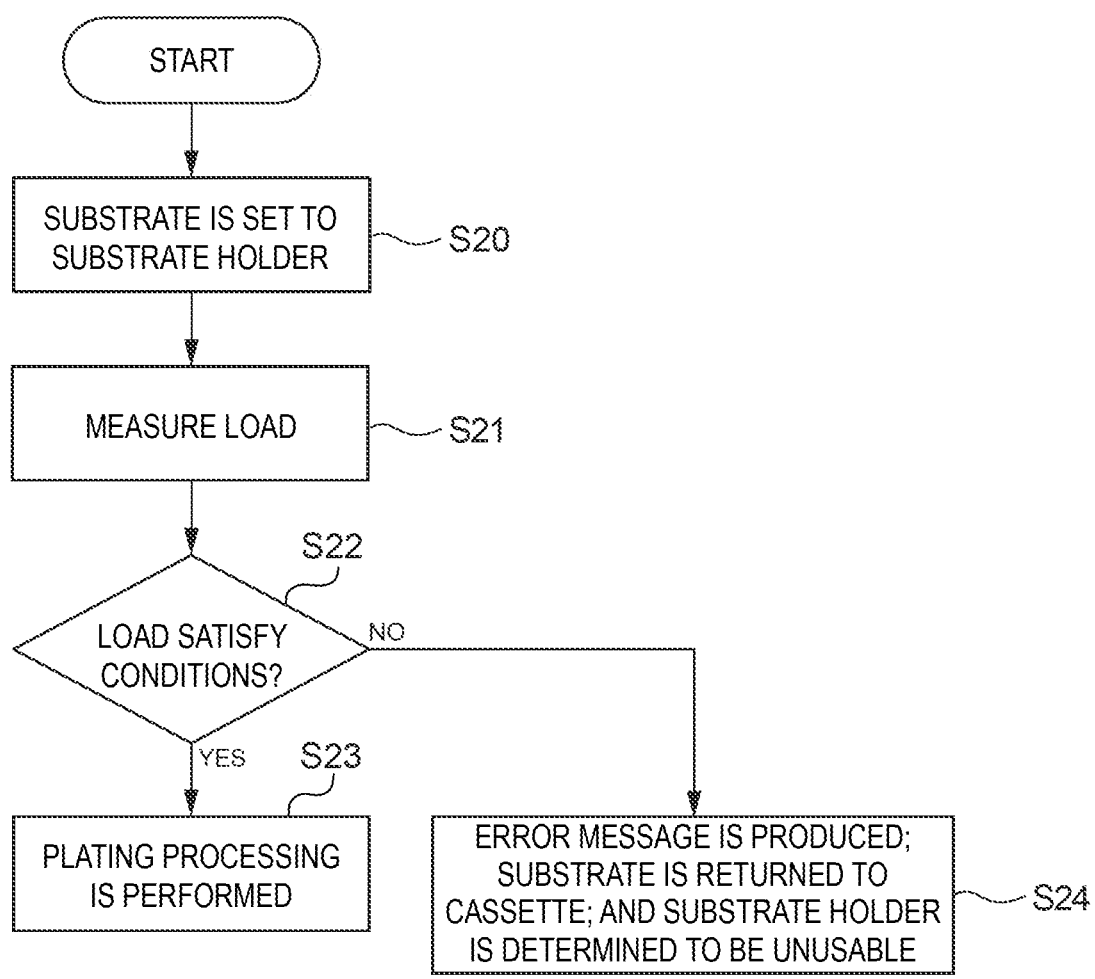
FIG. 10 is a flowchart showing measurement and judgment according to Embodiment 2.

FIG. 10 is a flowchart showing the measurement and the judgment according to the Embodiment 2. The measurement and the judgment are controlled and carried out according to the program stored in the memory 175B.

Step S20 places the substrate W on the support face 82a of the substrate holder 11 of the substrate attachment/detachment station 120 and then clamps the substrate W by closing the substrate holder 11. Step S20 then activates the motor drive mechanism 94 to press the seal ring holder 62 and the substrate seal member 66 against the substrate W by using the pressing member 92.

Step 21 measures the loads p by using the load cells 93 while the seal ring holder 62 and the substrate seal member 66 are pushed against the substrate W by the pressing member 92 before the substrate W is locked.

Step S22 makes a judgment as to whether the loads p measured by the load cells 93 are equal to or lower than the predetermined maximum acceptable value $p_{high}$ and fall within the predetermined value range $p_{range}$. If the loads p are equal to or lower than the predetermined maximum acceptable value $p_{high}$ and fall within the predetermined value range $p_{range}$, the sealing by the substrate seal member 66 is judged as normal. The process advances to Step S23, and the plating processing is carried out. If the loads p are higher than the predetermined maximum acceptable value $p_{high}$ or higher than the predetermined value range $p_{range}$ the sealing by the substrate seal member 66 is judged as abnormal, and the process moves to Step S24. Step S24 stops the pressing by the seal ring holder 62 and produces the error message. Step S24 further removes the substrate W from the substrate holder 11 and returns the substrate W to the cassette 100. The subject substrate holder 11 is determined to be unusable.

Alternatively, if the loads p measured by the load cells 93 are equal to or higher than the predetermined minimum acceptable value $p_{low}$ and fall within the predetermined value range $p_{range}$, the sealing by the substrate seal member 66 is judged as normal. The process then moves to Step S23, and the plating processing is carried out. If the loads p are lower than the predetermined minimum acceptable value $p_{low}$ or higher than the predetermined value range $p_{range}$, the sealing by the substrate seal member 66 is judged as abnormal, and the process moves to Step S24. Step S24 stops the pressing by the seal ring holder 62 and produces the error message. The subject substrate holder 11 is determined to be unusable.

According to a method of the Embodiment 2, prior to the plating processing, the deformed state of the seal at the time when the substrate W is held by the substrate holder 11 can be directly measured on the basis of the load p at which the substrate seal member 66 is pushed against the substrate W, and a judgment can be made on the basis of the measurement result as to whether the plating processing will be carried out. It is then possible to previously detect the leakage of the substrate seal member 66 and prevent defective plating. Therefore, the electrolytic plating processing can be carried out on preferable plating process conditions. It is also possible to delay the progress of leakage-associated wear damage or deterioration of parts, such as contacts, in the substrate holder. Since the thickness change of the substrate W can be absorbed by the thickness absorbing mechanism 88 according to the substrate holder 11, even if the thickness of the substrate W is changed, it is possible to maintain good sealing at the time of the substrate W is held by the substrate holder 11. This prevents a plating fluid leakage, damages on the substrate W, etc. Since the plating processing is carried out after it is confirmed that the loads p measured over the entire circumference of the substrate W fall within the predetermined value range, it is possible to prevent defective sealing attributable to variation of the deformed state, depending on the locations in the seal member. The compression amounts measured over the entire circumference of the substrate W fall within the predetermined value range. In the plating tank, therefore, the distance to an anode electrode can be made uniform over the entire circumference of the substrate W (variation can be made to fall within the predetermined value range), and the flow of the plating fluid can be made uniform over the entire circumference of the substrate W.

First Modification Example of Embodiment 2

The foregoing description explains the case in which the load is measured by the load cell 93. Instead, it is also possible to judge the normality and abnormality of the sealing on the basis of a load application rate (load factor) of the motor 94a of the motor drive mechanism 94. The motor 94a having a function of measuring the load application rate may be utilized. The load application rate may alternatively be calculated by detecting current of the motor 94a. In this case, the load cells 93 may be omitted.

Figure 11:
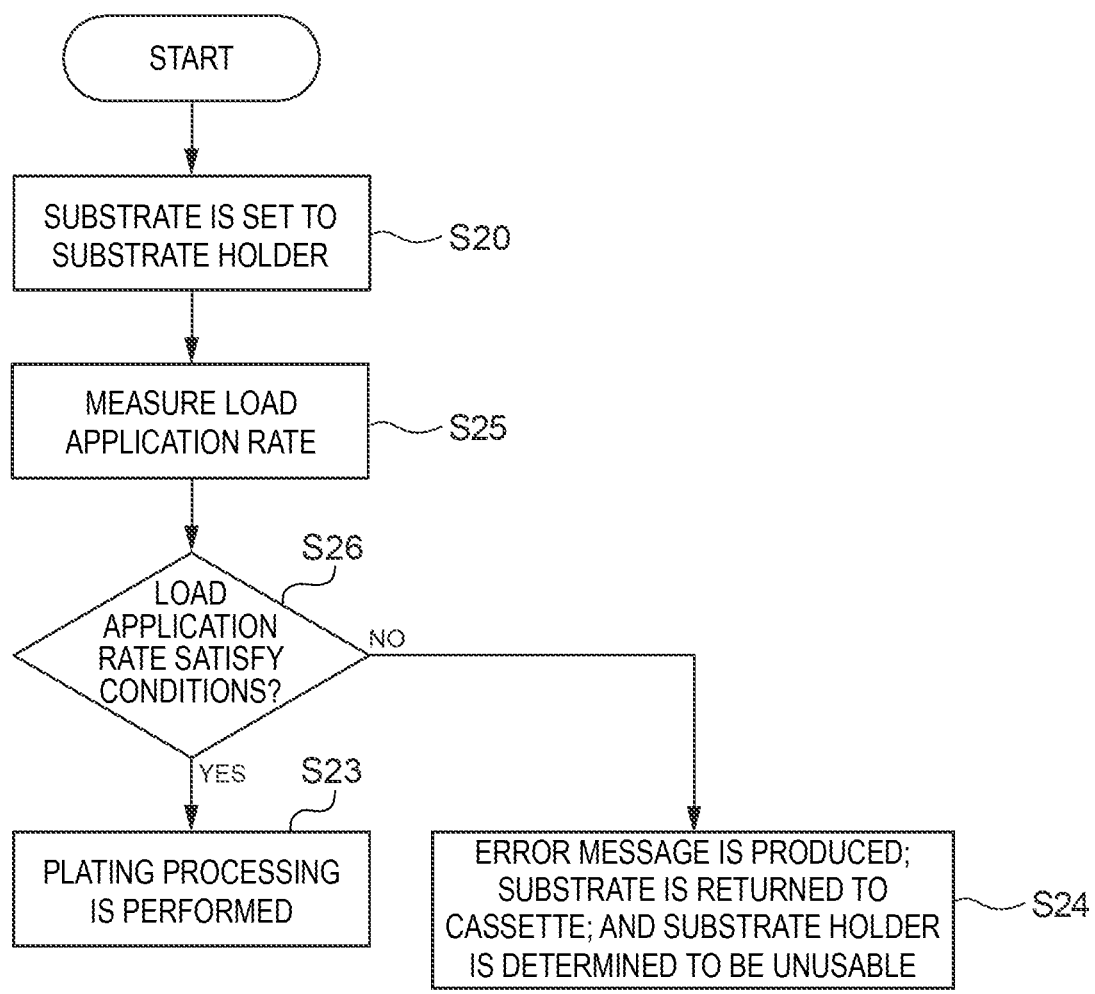
FIG. 11 is a flowchart showing measurement and judgment according to a first modification example of Embodiment 2.

FIG. 11 is a flowchart showing measurement and judgment according to a first modification example of the Embodiment 2.

Steps S20, S23, and S24 are the same as those shown in FIG. 10.

Step S25 measures a load application rate E of the motor 94a.

Step S26 makes a judgment as to whether the load application rate E falls in a range between a predetermined minimum acceptable value $E_{low}$ and a predetermined maximum acceptable value $E_{high}$. If the load application rate E is equal to or higher than the minimum acceptable value $E_{low}$ and also equal to or lower than the maximum acceptable value $E_{high}$, the sealing by the substrate seal member 66 is judged as normal. The process advances to Step S23, and the plating is carried out. If the load application rate E is lower than the minimum acceptable value $E_{low}$ or higher than the maximum acceptable value $E_{high}$, the sealing by the substrate seal member 66 is judged as abnormal, and the process moves to Step S24. Step S24 stops the pressing by the seal ring holder 62 and produces the error message. Step S24 removes the substrate W from the substrate holder 11 and returns the substrate W to the cassette 100. The subject substrate holder 11 is determined to be unusable. The predetermined minimum acceptable value $E_{low}$ and the predetermined maximum acceptable value $E_{high}$ are previously set on the basis of an experiment or the like as conditions for determining the normality of the sealing by the substrate seal member 66.

According to the present modification example, the load applied to the substrate seal member 66, namely, the deformed state of the substrate seal member 66 can be easily measured by the load application rate of the motor 94*a* that activates the pressing member 92.

Second Modification Example of Embodiment 2

The normality and abnormality of the sealing may be judged on the basis of both the loads measured by the load cells 93 and the load application rate of the motor 94*a*.

Figure 12:
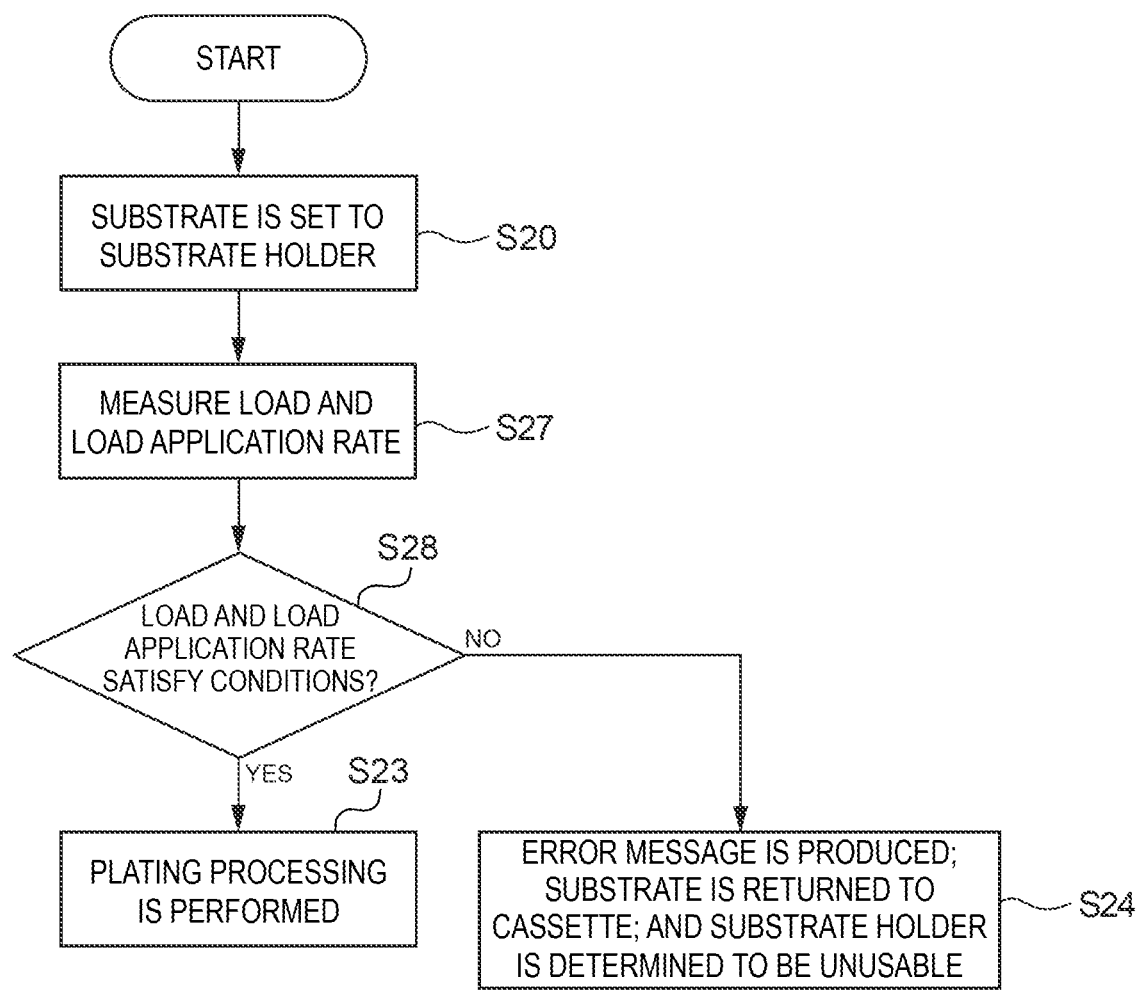
FIG. 12 is a flowchart showing measurement and judgment according to a second modification example of Embodiment 2.

FIG. 12 is a flowchart showing measurement and judgment according to a second modification example of the Embodiment 2.

Steps S20, S23, and S24 are the same as those shown in FIG. 10.

Step S27 measures the loads p by the load cells 93 and also measures the load application rate of the motor 94*a*.

Step S28 makes a judgment as to whether the loads p measured by the load cells 93 are equal to or lower than the predetermined maximum acceptable vale $p_{high}$ and also fall within the predetermined value range $p_{range}$. Step S28 further makes a judgment as to whether the load application rate E is equal to or higher than the predetermined minimum acceptable value $E_{low}$ and equal to or lower than the predetermined maximum acceptable value $E_{high}$. If the loads p are equal to or lower than the maximum acceptable vale $p_{high}$ and also fall within the value range $p_{range}$, and if the load application rate E is equal to or higher than the minimum acceptable value $E_{low}$ and equal to or lower than the maximum acceptable value $E_{high}$, the sealing by the substrate seal member 66 is judged as normal. The process moves to Step S23, which performs the plating processing. If at least either the loads p or the load application rate E fails to satisfy the above-mentioned conditions, it is judged that the sealing by the substrate seal member 66 is abnormal. The process then advances to Step S24. Step S24 stops the pressing by the seal ring holder 62 and produces the error message. Step S24 removes the substrate W from the substrate holder 11 and returns the substrate W to the cassette 100. The subject substrate holder 11 is determined to be unusable.

Alternatively, it is possible to judge whether the loads p measured by the load cells 93 are equal to or higher than the predetermined minimum acceptable value $p_{low}$ and fall within the predetermined value range $p_{range}$, and whether the load application rate E is equal to or higher than the predetermined minimum acceptable value $E_{low}$ and equal to or lower than the predetermined maximum acceptable value $E_{high}$. If the loads p are equal to or higher than the predetermined minimum acceptable value $p_{low}$ and also fall within the value range $p_{range}$, and if the load application rate E is equal to or higher than the minimum acceptable value $E_{low}$ and also equal to or lower than the maximum acceptable value $E_{high}$, the sealing by the substrate seal member 66 is judged as normal. The process then moves to Step S23, and the plating processing is carried out. If at least either the loads p or the load application rate E fails to satisfy the above-mentioned conditions, the sealing by the substrate seal member 66 is judged as abnormal, and the process advances to Step S24. Step S24 stops the pressing by the seal ring holder 62 and produces the error message. The subject substrate holder 11 is determined to be unusable.

Since the present modification example makes a judgment as to whether the sealing by the substrate seal member 66 is normal on the basis of the loads p and the motor load application rate E, the judgment can be made with higher accuracy.

Third Modification Example of Embodiment 2

The configuration of the Embodiment 1 and that of the Embodiment 2 may be combined together. To be more specific, the distance measurement by the distance sensor 91 of the Embodiment 1 (compression amount Δd or d=db−da during compression) may be incorporated into the processing of the flowcharts shown in FIGS. 10, 11 and 12. In this case, when all the conditions including the distance measurement result are satisfied, the sealing by the substrate seal member 66 may be judged as normal. When at least one of the conditions is not satisfied, the sealing by the substrate seal member 66 may judged as abnormal.

For example, in Step S21 shown in FIG. 10, not only the measurement of the loads p by the load cells 93 but also the measurement of the "compression amount" Δd by Step S11 shown in FIG. 8 is carried out. In Step S22 shown in FIG. 10, a judgment is made as to not only whether the conditions of the loads p are satisfied but also whether the conditions of the "compression amount" Δd by Step S12 shown in FIG. 8 are satisfied. When the loads p and the "compression amount" Δd satisfy the conditions, the sealing is judged as normal. Otherwise, the sealing is judged as abnormal. In this case, it is judged whether the sealing by the substrate seal member 66 is normal on the basis of the loads p and the "compression amount" Δd, so that the judgment can be made with higher accuracy.

In Step S25 shown in FIG. 11, not only the measurement of the motor load application rate E but also the measurement of the "compression amount" Δd by Step S11 shown in FIG. 8 is carried out. In Step S26 shown in FIG. 11, a judgment is made as to not only whether the conditions of the load application rate E are satisfied but also whether the conditions of the "compression amount" Δd of Step S12 shown in FIG. 8 are satisfied. When both the load application rate E and the "compression amount" Δd satisfy the conditions, the sealing is judged as normal. Otherwise, the sealing is judged as abnormal. In this case, it is judged whether the sealing by the substrate seal member 66 is normal on the basis of both the motor load application rate E and the "compression amount" Δd, so that the judgment can be made with higher accuracy.

Step S27 shown in FIG. 12 measures not only the loads p by the load cells 93 and the motor load application rate E but also the "compression amount" Δd by Step S11 shown in FIG. 8. Step S28 shown in FIG. 12 makes a judgment as to not only whether the conditions of the loads p and the load application rate E are satisfied but also whether the conditions of the "compression amount" Δd by Step S12 shown in FIG. 8 are satisfied. When the loads p, the load application rate E, and the "compression amount" Δd all satisfy the conditions, the sealing is judged as normal. Otherwise, the sealing is judged as abnormal. In this case, it is judged whether the sealing by the substrate seal member 66 is normal on the basis if the loads p, the load application rate E of the motor, and the "compression amount" Δd, so that the judgment can be made with higher accuracy.

Embodiment 3

Figure 13:
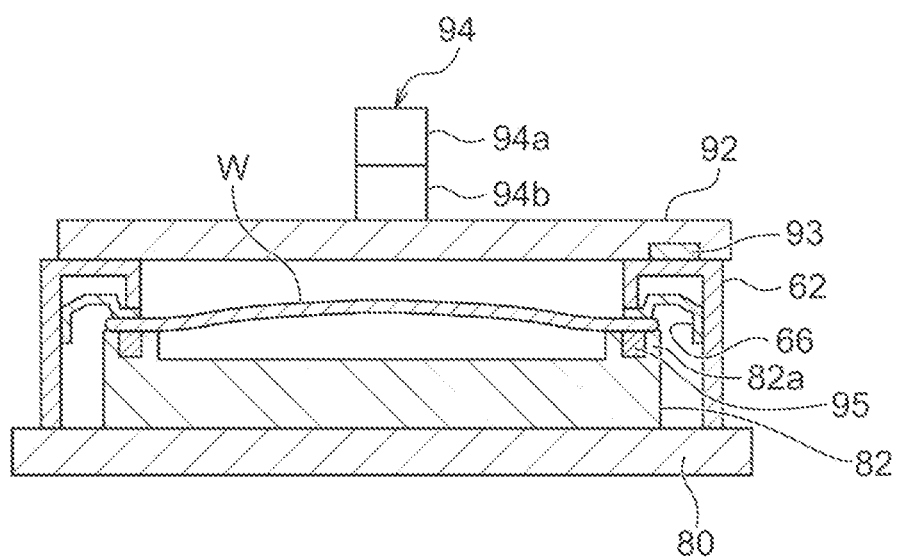
FIG. 13 shows a configuration of a measurement device configured to measure a deformed state of a seal according to Embodiment 3.

FIG. 13 shows a configuration of a measurement device for measuring a deformed state of a seal according to an Embodiment 3. FIG. 13 shows the substrate holder 11 and the pressing member 92, which are placed on the substrate attachment/detachment station 120. For simplicity's sake and easy understanding, FIG. 13 schematically shows the backing base 80, the movable base 82, the seal ring holder 62, and the substrate seal member 66 as the substrate holder 11, and omits the configuration including the compression spring 86, the clampers 84, etc. The load cell 93, although shown in FIG. 13, may be omitted unless the load cell 93 is used in modification examples mentioned later. The pressing member according to the present embodiment is not limited to the pressing member 92 of the Embodiment 2, but may be anything as long as it is capable of pushing the seal ring holder 62 down to a predetermined position at the time of locking the substrate holder 11.

The measurement device for measuring the deformed state of the seal according to the Embodiment 3 includes a plurality of pressure sensors 95 disposed or embedded in the ring-like support face 82a of the movable base 82. The plurality of pressure sensors 95 are arranged, for example, in sixteen places located at regular intervals on the circumference of the support face 82a (corresponding to the circumference of the outer circumferential portion of the substrate W). The pressure sensors 95 can be disposed or embedded in a region of the support face 82a. The pressure sensors 95 may be of any type as long as they are capable of detecting pressures at plural places individually. In one example, the pressure sensors 95 may be film-like pressure-sensitive sensors capable of detecting pressures at plural places individually. Alternatively, for example, if the substrate W has a rectangular shape, it is possible to provide two pressure sensors 95 in the vicinity of each corner so that at least each corner of the outer circumferential portion of the substrate W is located between the corresponding two pressure sensors 95. In other words, eight pressure sensors 95 are disposed in the support face 82a.

After the substrate W is placed on the support face 82a of the movable base 82 and clamped by the seal ring holder 62, the seal ring holder 62 is pressed downward by the pressing member 92. After the seal ring holder 62 is lowered to a predetermined position at which the upper face of the protruding portion 72a of the holddown ring 72 becomes lower than a lower face of the clamper 84, the holddown ring 72 is pivoted to a position at which the protruding portion 72a of the holddown ring 72 coincides with the clamper 84, and the pressing by the pressing member 92 is released. As the result, the substrate holder 11 is locked, and the substrate W is clamped between the seal ring holder 62 and the movable base 82. At this time, the pressure sensors 95 detect or measure a pressing force (pushing force) f. The pressing force f corresponds to load applied to the substrate seal member 66 when the substrate holder 11 is locked. In the other embodiments, the pressing member 92 may be lowered to the predetermined position to push the seal ring holder 62, and simultaneously, the pressing force (pushing force) f may be detected or measured by the pressure sensors 95.

If maximum and minimum values of pressing forces f detected or measured at plural places of the outer circumferential portion of the substrate W are $f_{max}$ and $f_{mini}$, respectively, whether the sealing by the substrate seal member 66 is normal is judged as below on the basis of the pressing forces f.

If the measured pressing forces f ($f_{max}$ to $f_{mini}$) are equal to or lower than a predetermined maximum acceptable value $f_{high}$ ($f \leq f_{high}$) and also fall within a predetermined value range $f_{range}$ ($|f_{max}-f_{mini}| \leq f_{range}$) the sealing by the substrate seal member 66 is judged as normal. If the pressing forces f ($f_{max}$ to $f_{mini}$) are higher than the predetermined maximum acceptable value $f_{high}$ ($f_{high} < f$) or higher than the predetermined value range $f_{range}$ ($|f_{max}-f_{mini}| > f_{range}$) the sealing by the substrate seal member 66 is judged as abnormal. If it is judged that the sealing by the substrate seal member 66 is abnormal, the error message is produced. The substrate W is removed from the substrate holder 11 and returned to the cassette 100. The substrate holder 11 is determined to be unusable. When the pressing forces f are measured while the seal ring holder 62 is being pushed by the pressing member 92, the process not only produces the error message but also stops the pushing of the seal ring holder 62.

Alternatively, the sealing by the substrate seal member 66 may be judged as normal when the measured pressing forces f ($f_{max}$ to $f_{mini}$) are equal to or higher than the predetermined minimum acceptable value $f_{low}$ and also fall within the predetermined value range $f_{range}$ ($|f_{max}-f_{mini}| \leq f_{range}$). In this respect, the sealing by the substrate seal member 66 may be judged as abnormal when the pressing forces f ($f_{max}$ to $f_{mini}$) are lower than the predetermined minimum acceptable value $f_{low}$ ($f < f_{low}$) or higher than the predetermined value range $f_{range}$. When it is judged that the sealing by the substrate seal member 66 is abnormal, the error message is produced. The substrate W is removed from the substrate holder 11 and returned to the cassette 100. The substrate holder 11 is determined to be unusable.

The predetermined maximum acceptable value $f_{high}$, the predetermined minimum acceptable value $f_{low}$, and the predetermined value range $f_{range}$ are previously set on the basis of an experiment or the like as conditions for determining the normality of the sealing by the substrate seal member 66.

FIG. 14 is a flowchart of measurement and judgment according to the Embodiment 3. The measurement and the judgment are controlled and carried out according to the program stored in the memory 175B.

In Step S30, the substrate W is placed on the support face 82a of the substrate holder 11 of the substrate attachment/detachment station 120, and the substrate holder 11 is closed. The motor drive mechanism 94 is activated to move the pressing member 92 downward to a predetermined position (a preset position at which the upper face of the protruding portion 72a of the holddown ring 72 is lower than the lower face of the clamper 84). The pressing member 92 is thus used to push the seal ring holder 62 and the substrate seal member 66 against the substrate W. In this state, the holddown ring 72 is pivoted so that the protruding portions 72a of the holddown ring 72 coincide with the inward projections 84a of the clamper 84. The pressing member 92 is raised to release the pressing. As the result, the substrate holder 11 is locked, and the substrate W is clamped by the substrate holder 11. The pressing member 92 is then removed upward.

In Step S31, the pressing forces f are measured by the pressure sensors 95 while the substrate W is being clamped by the substrate holder 11. If the pressing forces f are measured with the seal ring holder 62 pushed by the pressing member 92, the pressing forces f are measured by the pressure sensors 95 in a step before the pressing is released by raising the pressing member 92.

Step S32 makes a judgment as to whether the pressing forces f measured by the pressure sensors 95 ($f_{max}$ to $f_{mini}$) are equal to or lower than the predetermined maximum acceptable value $f_{high}$ and also fall within the predetermined value range $f_{range}$. If the pressing forces f are equal to or lower than the predetermined maximum acceptable value $f_{high}$ and also fall within the predetermined value range $f_{range}$, it is judged that the sealing by the substrate seal member 66 is normal. The process then advances to Step S33, which carries out the plating processing. If the pressing forces f are higher than the predetermined maximum acceptable value $f_{high}$ or higher than the predetermined value range $f_{range}$, the sealing by the substrate seal member 66 is judged as abnormal. The process moves to Step S34 and produces the error message. Step S34 removes the substrate W from the substrate holder 11 and returns the substrate W to the cassette 100. The substrate holder 11 is determined to be unusable. If the pressing forces f are measured with the seal ring holder 62 pushed by the pressing member 92, the error message is produced, and the pushing by the seal ring holder 62 is stopped.

Alternatively, if the pressing forces f measured by the pressure sensors 95 ($f_{max}$ to $f_{mini}$) are equal to or higher than the predetermined minimum acceptable value $f_{low}$ and also fall within the predetermined value range $f_{range}$ (|$f_{max}$−$f_{mini}$|≤$f_{range}$) the sealing by the substrate seal member 66 is judged as normal. The process moves to Step S33, which performs the plating processing. If the pressing forces f ($f_{max}$ to $f_{mini}$) are lower than the predetermined minimum acceptable value $f_{low}$ (f<$f_{low}$) or higher than the predetermined value range $f_{range}$, the sealing by the substrate seal member 66 is judged as abnormal, and the process moves to Step S34. When the sealing by the substrate seal member 66 is judged as abnormal, the error message is produced, and the substrate W is removed from the substrate holder 11 and returned to the cassette 100. The substrate holder 11 is determined to be unusable.

During the plating processing, the pressing forces f are measured by the pressure sensors 95 of the substrate holder 11 to be monitored (Steps S35 and S36). Step S35 measures the pressing forces f by using the pressure sensors 95 during the plating processing. Step S36, like Step S32, makes a judgment as to whether the pressing forces f measured by the pressure sensors 95 ($f_{max}$ to $f_{mini}$) satisfy the above-mentioned conditions. If the pressure forces f satisfy the above-mentioned conditions during the plating processing, Step S37 normally carries out processing including post-plating washing, drying, storage in the cassette, etc. If it is detected that the pressing forces f do not satisfy the above-mentioned conditions during the plating processing, Step S38 produces the error message and determines that the subject substrate holder 11 is unusable after the plating processing. Step S38 also removes the substrate W plated by using the subject substrate holder 11 from the subsequent steps as required. The pressing forces f may be constantly monitored during the plating processing to judge whether the above-mentioned conditions are satisfied. Alternatively, the pressing forces f may be monitored at predetermined time intervals, once or more times during the plating processing to judge whether the above-mentioned conditions are satisfied.

According to the Embodiment 3, prior to the plating processing, the deformed state of the seal at the time when the substrate W is held by the substrate holder 11 can be directly measured on the basis of the pressing forces f at which the substrate seal member 66 is pushed against the substrate W. On the basis of the measurement result, a judgment can be made as to whether the plating processing will be carried out. It is then possible to previously detect the leakage of the substrate seal member 66 and prevent defective plating. Therefore, the electrolytic plating processing can be carried out on preferable plating process conditions. It is also possible to delay the progress of leakage-associated wear damage or deterioration of parts, such as contacts, in the substrate holder. Since the thickness change of the substrate W can be absorbed by the thickness absorbing mechanism 88 in the substrate holder 11, even if the thickness of the substrate W is changed, good sealing at the time of the substrate W is held by the substrate holder 11 can be maintained, which prevents a plating fluid leakage, damages on the substrate W, etc. Since the plating processing is carried out after it is confirmed that the pressure forces f measured over the entire circumference of the substrate W are within the predetermined value range, it is possible to prevent defective sealing attributable to variation of the deformed state depending on the locations in the seal member. Since the compression amounts measured over the entire circumference of the substrate W fall within the predetermined value range, the distance to the anode electrode can be made uniform over the entire circumference of the substrate W (variation can be made to fall within the predetermined value range), and the flow of the plating fluid can be made uniform over the entire circumference of the substrate W, in the plating tank.

Furthermore, since the apparatus according to the Embodiment 3 monitors measured values of the pressing forces f by using the pressure sensors 95 of the substrate holder 11 during the plating processing, it is possible to remove the substrate holder 11 and the substrate W which become poor in sealing during the plating processing and thus further improve reliability of the plating processing.

Modification Example of Embodiment 3

Two or more of the configurations according to the Embodiments 1 to 3 may be combined together. In this case, in Steps S31 and S32 of FIG. 14, two or more of the "compression amount" Δd measured by the distance sensor 91, the loads p measured by the load cells 93, the motor load application rate E, and the pressing forces f measured by the pressure sensors 95 may be combined together to judge the normality/abnormality of the sealing.

For example, in Step S31 of FIG. 14, the "compression amount" Δd (or d=db−da) is measured by the distance sensor 91, and the pressing forces f are measured by the pressing sensor 95. In Step S32, if the "compression amount" Δd (or d=db−da) and the pressing forces f satisfy the above-mentioned conditions, the sealing by the substrate seal member 66 is judged as normal. Otherwise, the sealing by the substrate sealing member 66 is judged as abnormal.

Step S31 of FIG. 14 measures the loads p using the load cells 93 and/or the motor load application rate E, and measures the pressing forces f using the pressure sensors 95. In Step S32, if the loads p (and/or the load application rate E) and the pressing forces f all satisfy the above-mentioned conditions, it is judged that the sealing by the substrate seal member 66 is normal. Otherwise, it is judged that the sealing by the substrate seal member 66 is abnormal.

Alternatively, Step S31 of FIG. 14 carried out the measurement of the "compression amount" Δd (or d=db−da) using the distance sensor 91, the measurement of the loads p using the load cells 93 and/or the measurement of the motor load application rate E. Step S31 further carries out the measurement of the pressing forces f using the pressure sensors 95. In Step S32, if the "compression amount" Δd (or d=db−da), the loads p (and/or the load application rate E), and the pressing forces f all satisfy the above-mentioned conditions, it is judged that the sealing by the substrate seal member 66 is normal. Otherwise, it is judged that the sealing by the substrate seal member 66 is abnormal.

The above-described embodiments directly measure the deformed state (pressed state) of the seal member at the time when the substrate is held by the substrate holder. On the basis of the measurement results, whether the plating processing will be carried out can be judged. It is therefore possible to previously detect the leakage of the seal member and prevent defective plating.

The substrate holder 11 that has passed the check of the substrate support face 82a, which is described above with reference to FIG. 5, may be subjected to the check on the sealing illustrated in FIGS. 10 to 14. The use of the substrate holder 11 that has passed the check on the flatness of the substrate support face 82a and also has passed the check on the sealing not only provides the effect of preventing the leakage through the sealing but also an effect of decreasing the possibility that the substrate holder with the substrate support face 82a having irregularity (including a case in which dust is on the substrate support face 82a) is used in the plating processing. This makes it easy to secure the uniformity of the plating film and more reliably prevent troubles caused by leakage.

At least the following technical concepts can be recognized from the above-disclosed embodiments.

[1] According to an embodiment, there is provided a plating apparatus for plating a substrate by using a substrate holder including an elastic projection that seals a to-be-plated surface of the substrate. The plating apparatus comprising: a measurement device configured to measure a deformed state of the elastic projection by measuring at least either one of a compression amount of the elastic projection and load applied to the elastic projection at a time when the substrate physically contacts the elastic projection of the substrate holder; and a controlling device configured to make a judgment on the basis of the measured deformed state as to whether sealing by the elastic projection is normal. The plating apparatus here comprises not only a plating apparatus as a single body but also a system or apparatus in which the plating apparatus and a polishing apparatus are combined together, and an apparatus including a plating processer.

The plating apparatus directly measures, prior to plating processing, the compression amount of the elastic projection (elastic sealing portion) can be directly measured at a time when the substrate is being held by the substrate holder, and a judgment can be made on the basis of a result of the measurement as to whether the plating processing will be performed. It is then possible to previously detect leakage of the elastic projection and prevent defective plating. This allows electrolytic plating processing to be performed on preferable plating process conditions. It is also possible to delay the progress of leakage-associated wear damage or deterioration of parts, such as contacts, in the substrate holder.

[2] The substrate holder includes a seal ring holder configured to hold or include the elastic projection. The measurement device includes a distance sensor configured to measure distance to an upper face of the seal ring holder of the substrate holder and distance to an upper face of the substrate. The compression amount can be calculated from difference between the distance to the upper face of the seal ring holder and the distance to the upper face of the substrate. The distance between the upper face of the seal ring holder and the upper face of the substrate corresponds to a dimension extending in a direction that the elastic projection (elastic sealing portion) is compressed, which makes it possible to directly measure the compression size or compression amount of the elastic projection. As described above, the deformed state of the elastic projection can be measured with a simpler configuration, as compared to when pressure in an internal space of the substrate holder is measured.

[3] The plating apparatus may be configured so that the compression amount is measured at plural places in an outer circumferential portion of the substrate; and that the controlling device determines that the sealing by the elastic projection is normal and implements the plating processing with respect to the substrate held by the substrate holder when values of the compression amounts satisfy a first condition that the values of the compression amounts are equal to or higher than a first value and fall within a first value range, and determines that the sealing by the elastic projection is abnormal and does not implement the plating processing with respect to the substrate held by the substrate holder when the values of the compression amounts fail to satisfy the first condition. If the apparatus is thus configured, the difference (distance) is measured at the plural places in the outer circumferential portion of the substrate, so that the deformed state of the elastic projection (elastic sealing portion) can be accurately measured along the outer circumferential portion of the substrate. In addition, since it is determined not only whether the values of the compression amounts are equal to or higher than the first value but also whether the values of the compression amounts vary within the first value range, poor sealability can be prevented, which is caused by variation of the deformed state depending on the locations in the elastic projection.

[4] The controlling device may be configured so that the substrate is removed from the substrate holder, and the substrate holder is determined to be unusable, when the values of the compression amounts fail to satisfy the first condition. If the controlling device is thus configured, the substrate holder in which abnormality has been found will not be used in the subsequent plating processes, and the plating processing is continued using another substrate holder.

[5] The distance sensor may be configured to scan the entire outer circumferential portion of the substrate, and the compression amount may be calculated over the entire outer circumferential portion of the substrate. If the distance sensor is thus configured, it is possible to confirm the deformed state of the elastic projection (elastic sealing portion) over the entire outer circumferential portion of the substrate and precisely determine the condition of the sealing by the elastic projection.

[6] The distance sensor may comprise a plurality of distance sensors disposed in the outer circumferential portion of the substrate, and the compression amount may be calculated at positions where the plurality of distance sensors are located. In this case, the deformed state can be confirmed over substantially the entire elastic seal member, and the condition of the sealing by the elastic projection (elastic sealing portion) can be precisely determined without a configuration for moving the distance sensor.

[7] According to an embodiment, there is provided a plating apparatus in which the substrate holder includes a seal ring holder configured to hold or include the elastic projection. The measurement device includes a pressing member configured to press the seal ring holder. The pressing member includes a plurality of load cells. Load that is applied to the elastic projection is measured by the plurality of load cells when the pressing member presses the seal ring holder. In this case, since the load applied to the elastic projection (elastic sealing portion) is measured by the plurality of load cells provided to the pressing member, it is possible to confirm the deformed state over substantially the entire elastic projection and precisely determine the condition of the sealing by the elastic seal member.

[8] The controlling device may be configured to determine that the sealing by the elastic projection is normal and implement the plating processing with respect to the substrate when values of the loads which have been measured by the plurality of load cells satisfy a second condition that the values of the loads are equal to or lower than a second value and fall within a second value range, and determine that the sealing by the elastic projection is abnormal and does not implement the plating processing with respect to the substrate held by the substrate holder when the values of the loads fail to satisfy the second condition. If the controlling device is thus configured, it is determined not only whether the values of the loads are equal to or lower than the second value and also whether variation of the values of the loads falls within the second value range. It is therefore possible to prevent poor sealability that is caused by variation of the deformed state depending on the locations in the elastic projection (elastic sealing portion).

[9] The controlling device may be configured so that the substrate is removed from the substrate holder, and the substrate holder is determined to be unusable, when the values of the loads fail to satisfy the second condition. If the controlling device is thus configured, the substrate holder in which abnormality has been found will not be used in the subsequent plating processes, and the plating processing is continued using another substrate holder.

[10] The pressing member may be driven by a motor. The load applied to the elastic projection may be measured on the basis of a load application rate of the motor at a time when the seal ring holder is pressed by the pressing member to move down to a predetermined position. In this case, the load applied to the elastic projection (elastic sealing portion) or the deformed state of the elastic projection can be measured without difficulty.

[11] The controlling device may be configured to determine that the sealing by the elastic projection is normal and implement the plating processing with respect to the substrate when a measured value of the load application rate of the motor satisfies a third condition that the value is equal to or higher than a third value and is equal to or lower than a fourth value that is higher than the third value, and determine that the sealing by the elastic projection is abnormal and does not implement the plating processing with respect to the substrate that is held by the substrate holder when the measured value of the load application rate of the motor fails to satisfy the third condition. In this case, it can be easily judged whether the sealing by the elastic projection (elastic sealing portion) is normal by judging whether the load application rate of the motor that drives the pressing member is between the third and fourth values.

[12] The controlling device may be configured so that the substrate is removed from the substrate holder, and the substrate holder is determined to be unusable, when the measured value of the load application rate of the motor fails to satisfy the third condition. If the controlling device is thus configured, the substrate holder in which abnormality has been found will not be used in the subsequent plating processes, and the plating processing is continued using another substrate holder.

[13] According to an embodiment, there is provided a plating apparatus, in which the plating apparatus comprises the substrate holder; and the substrate holder includes a plurality of pressure sensors arranged in a surface of the substrate holder, with which the substrate comes to contact. The loads applied to the elastic projection can be measured by the plurality of pressure sensors when the substrate is locked to the substrate holder. In this case, since the substrate is provided with the pressure sensors, a configuration for directly measuring the deformed state of the elastic projection (elastic sealing portion) can be materialized substantially with no or minimal alteration to the other configurations of the plating apparatus. Furthermore, since the loads applied to the elastic projection are measured by the plurality of pressure sensors provided to the substrate holder, it is possible to confirm the deformed state over substantially the entire elastic projection and precisely determine the condition of the sealing by the elastic projection.

[14] The controlling device may be configured to determine that the sealing by the elastic projection is normal and implement the plating processing with respect to the substrate when values of the loads which are measured by the plurality of pressure sensors satisfy a fourth condition that the values of the loads are equal to or lower than a fifth value and are within a fourth value range, and determine that the sealing by the elastic projection is abnormal and does not implement the plating processing with respect to the substrate that is held by the substrate holder when the values of the loads fail to satisfy the fourth condition. In this case, it is determined whether the values of the loads are equal to or lower than the fifth value and whether variation of the load values is within the fourth value range. It is therefore possible to prevent poor sealability that is caused by the variation of the deformed state depending on the locations in the elastic projection (elastic sealing portion).

[15] The controlling device may be configured so that the substrate is removed from the substrate holder, and the substrate holder is determined to be unusable, when the values of the loads fail to satisfy the fourth condition. If the controlling device is thus configured, the substrate holder in which abnormality has been found will not be used in the subsequent plating processes, and the plating processing is continued using another substrate holder.

[16] The controlling device may be configured to measure the loads applied to the elastic projection by using the plurality of pressure sensors and judge whether the values of the loads satisfy the fourth condition during the plating processing. In this case, since a measured value of a pressing force is monitored by the pressure sensor of the substrate holder during the plating processing, it is possible to remove the substrate holder and the substrate, in which a sealed state has become poor during the plating processing. This further improves reliability of the plating processing.

[17] The controlling device may be configured so that, when the load values fail to satisfy the fourth condition during the plating processing, the substrate holder is determined to be unusable after the plating processing. If the controlling device is thus configured, the substrate in which abnormality has been found will not be used in the subsequent plating processing, and the plating processing is continued using another substrate holder.

[18] The substrate holder may be configured to include a backing base and a movable base that is disposed to be movable relative to the backing base, and may be configured so that the substrate comes into contact with the movable base. In this case, it is possible to absorb variation in warpage and thickness of the substrate and thus maintain good sealing at the time when the substrate is held by the substrate holder. This prevents leakage of plating fluid, damages on the substrate, etc.

[19] The plating apparatus may be further provided with a substrate attachment/detachment station for attaching/detaching the substrate to and from the substrate holder, and the deformed state of the elastic projection may be measured in the substrate attachment/detachment station. In this case, since the deformed state of the elastic projection (elastic sealing portion) is measured in the substrate attachment/detachment station where the substrate is attached to the substrate holder, it is possible to judge whether the sealing by the elastic projection is normal or abnormal, prior to the plating processing.

[20] A substrate holder according to an embodiment comprises: a first holding member including a support face with which a substrate comes into contact; a second holding member configured to clamp an outer circumferential portion of the substrate to detachably hold the substrate in consort with the first holding member; an elastic projection configured to seal a gap between the second holding member and the outer circumferential portion of the substrate when the substrate is clamped between the first and second holding members; and at least one pressure sensor that is disposed or embedded in the support face of the first holding member and configured to detect a pressing force at which the substrate is pressed by the second holding member and the elastic projection.

Since the above-described substrate holder is provided with the pressure sensor, a configuration for directly measuring the deformed state of the elastic projection (elastic sealing portion) can be materialized substantially with no or minimal alteration to the other configurations of the plating apparatus. If the pressing force(s) (load(s)) applied to the elastic projection is/are measured by a plurality of pressure sensors provided to the substrate holder, it is possible to confirm the deformed state over substantially the entire elastic projection and precisely determine the condition of the sealing by the elastic projection.

[21] The at least one pressure sensor may comprise a plurality of pressure sensors that are arranged at regular intervals in the support face. In this case, it is possible to confirm the deformed state of the elastic projection (elastic sealing portion) uniformly and highly accurately over the entire outer circumferential portion of the substrate and thus precisely determine the condition of the sealing by the elastic projection.

[22] The first holding member may include a backing base and a movable base that is disposed to be movable relative to the backing base. The support face may be provided to the movable base. In this case, it is possible to absorb variation in warpage and thickness of the substrate and thus maintain good sealing at the time when the substrate is held by the substrate holder. This prevents leakage of plating fluid, damages on the substrate, etc.

[23] A plating apparatus controlling method according to one aspect of the invention is a method for controlling a plating apparatus configured to plate a substrate by using a substrate holder including an elastic projection that seals a to-be-plated surface of the substrate. According to the method, a deformed state of the elastic projection is measured by measuring at least either one of a compression amount of the elastic projection and load applied to the elastic projection at a time when the substrate physically contacts the elastic projection of the substrate holder. A judgment is made on the basis of the measured deformed state as to whether sealing by the elastic projection is normal. Plating processing is performed with respect to the substrate that is held by the substrate holder in which the sealing by the elastic projection is judged as normal.

According to the plating apparatus controlling method, prior to plating processing, the compression amount of the elastic projection (elastic sealing portion) at the time when the substrate is held by the substrate holder is directly measured, and it is determined on the basis of a result of the measurement whether the plating processing will be carried out. It is therefore possible to previously detect leakage of the elastic projection and prevent defective plating. Consequently, electrolytic plating processing can be performed on preferable plating process conditions. It is also possible to delay the progress of leakage-associated wear damage or deterioration of parts, such as contacts, in the substrate holder.

[24] A record medium according to an embodiment is a storage medium configured to store a program for instructing a computer to implement the plating apparatus controlling method that performs plating processing with respect to a substrate by using a substrate holder including an elastic projection that seals a to-be-plated surface of the substrate. The storage medium stores a program for instructing the computer to measure the deformed state of the elastic projection by measuring at least either one of a compression amount of the elastic projection and load applied to the elastic projection at the time when the substrate physically contacts the elastic projection of the substrate holder, make a judgment as to whether sealing by the elastic projection is normal or abnormal on the basis of the measured deformed state, and perform the plating processing with respect to the substrate that is held by the substrate holder in which the sealing by the elastic projection is judged as normal.

According to the storage medium configured to store the program for instructing a computer to implement the plating apparatus controlling method, prior to the plating processing, the compression amount of the elastic projection (elastic sealing portion) can be directly measured at the time when the substrate is held by the substrate holder, and a judgment can be made on the basis of a result of the measurement as to whether the plating processing will be carried out. It is then possible to previously detect leakage of the elastic projection and prevent defective plating. Electrolytic plating processing therefore can be performed on preferable process conditions. It is also possible to delay the progress of leakage-associated wear damage or deterioration of parts, such as contacts, in the substrate holder.

The embodiments of the invention have been described on the basis of several examples. The above-mentioned embodiments of the invention are not intended to limit the invention but to facilitate the understanding of the invention. Needless to say, the invention may be modified or improved without deviating from the gist thereof, and includes equivalents thereto. For example, the concepts of the "substrate holder" and the "wafer holder" in general include various combinations and partial combinations of parts, which are engaged with the substrate and make it possible to transfer and position the substrate. The constituent elements mentioned in the claims and the description may be arbitrarily combined or omitted as long as at least a part of the above-mentioned problem is solved or at least a part of the advantageous effects is produced. For example, a so-called cup-style electrolytic plating apparatus may be configured so that, before the substrate is fixed to or held by a so-called cup, a checking device for checking a substrate support face as with the above-described embodiments checks whether there is irregularity in a substrate holding face that is formed in a member of the cup, which comes into contact with a substrate; the substrate will be held by the cup having the substrate holding face judged to have no irregularity, while the cup having the substrate holding face judged to have inacceptable irregularity or a member having the substrate holding face that is detachable from the cup is determined to be unusable. Furthermore, after the substrate is held by the cup, it is checked by the same method as the present invention whether the elastic seal member provided to the cup for sealing the substrate seals the substrate normally. The cup judged as abnormal is determined to be unusable. The plating processing is performed with respect only to the substrate that is held by the cup judged as normal. This makes it possible to previously detect the leakage of the seal member and more reliably prevent defective plating also in the cup-style electrolytic plating apparatus. Another modification example may be configured so as to check irregularity in the substrate holding face of the substrate holder in a state where the substrate holder is vertically installed, and then check the condition of the sealing by the elastic seal member of the substrate holder by using the checking device as the one described above at the time when the substrate is held by the substrate support face of the substrate holder that is vertically installed.

REFERENCE MARKS 1 plating apparatus
10 plating tank
11 substrate holder
18 paddle
19 paddle driving device
49 wire
50 cell
54 first holding member (fixed holding member)
56 hinge
58 second holding member (movable holding member)
59 first contact member
59a contact
60 base
62 seal ring holder
62a stepped portion
64 substrate seal line
66 substrate seal member
66a projecting portion
66b downward projection
68 holder seal member
68a downward projection
69 second contact member
69a contact
70 fixed ring
72 holddown ring
72a protruding portion
74 spacer
80 support base
80a protruding portion
82 movable base
82a support face
82b recessed portion
82d cutoff portion
84 clamper
84a inward projection
86 compression spring
88 thickness absorbing mechanism
90 optical sensor
91 distance sensor
91a first sensor
91b second sensor
92 pressing member
93 load cell
94 motor drive mechanism
94a motor
94b rotary-linear motion converting mechanism
95 pressure sensor
96 scanner
100 cassette
102 cassette table
104 aligner
106 spin rinse dryer
120 substrate attachment/detachment station
122 substrate transfer device
124 stocker
126 prewet tank
128 presoak tank
130a first washing tank
130b second washing tank
132 blow tank
140 substrate holder transfer device
142 first transporter
144 second transporter
150 rail
152 placement plate
170A load/unload section
170B plating processing section
175 controller
175B memory
175C controlling section

What is claimed is:

1. A substrate holder comprising:
   a first holding member including a support face with which a substrate comes into contact;
   a second holding member configured to clamp an outer circumferential portion of the substrate to detachably hold the substrate in consort with the first holding member;
   an elastic projection configured to seal a gap between the second holding member and the outer circumferential portion of the substrate when the substrate is clamped between the first and second holding members; and
   at least one pressure sensor that is disposed or embedded in the support face of the first holding member and configured to detect a pressing force at which the substrate is pressed by the second holding member and the elastic projection.

2. The substrate holder according to claim 1, wherein the at least one pressure sensor comprises a plurality of pressure sensors that are arranged at regular intervals in the support face.

3. The substrate holder according to claim 1, wherein the first holding member includes a backing base and a movable base that is disposed to be movable relative to the backing base, and the support face is provided to the movable base.

* * * * *